(12) United States Patent
Lorenzini Gutierrez et al.

(10) Patent No.: US 12,080,626 B1
(45) Date of Patent: Sep. 3, 2024

(54) SYSTEM AND METHOD FOR PROVIDING DIRECT SILICON FOOTPRINT MICROFLUIDIC COOLING FOR ELECTRONICS

(71) Applicant: Georgia Tech Research Corporation, Atlanta, GA (US)

(72) Inventors: Luis Daniel Lorenzini Gutierrez, Atlanta, GA (US); Yogendra Joshi, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 205 days.

(21) Appl. No.: 16/789,824

(22) Filed: Feb. 13, 2020

Related U.S. Application Data

(60) Provisional application No. 62/805,119, filed on Feb. 13, 2019.

(51) Int. Cl.
| | |
|---|---|
| H01L 23/473 | (2006.01) |
| F28F 3/02 | (2006.01) |
| H01L 23/00 | (2006.01) |
| H01L 23/40 | (2006.01) |
| H05K 7/20 | (2006.01) |

(52) U.S. Cl.
CPC ............ *H01L 23/473* (2013.01); *F28F 3/02* (2013.01); *H01L 23/4006* (2013.01); *H01L 24/32* (2013.01); *H05K 7/20254* (2013.01); *H05K 7/20272* (2013.01); *H01L 2023/405* (2013.01); *H01L 2023/4087* (2013.01); *H01L 24/16* (2013.01); *H01L 24/73* (2013.01); *H01L 2224/16225* (2013.01); *H01L 2224/32245* (2013.01); *H01L 2224/73253* (2013.01)

(58) Field of Classification Search
CPC .... F28F 3/02; H05K 7/20254; H05K 7/20272
See application file for complete search history.

(56) References Cited

U.S. PATENT DOCUMENTS

| | | | | |
|---|---|---|---|---|
| 8,302,671 | B2 * | 11/2012 | Sauer ...................... | B23P 15/26 165/80.4 |
| 10,561,040 | B1 * | 2/2020 | Lunsman ........... | H05K 7/20272 |
| 2002/0084060 | A1 * | 7/2002 | Sasaki ................. | H01L 23/3672 165/185 |
| 2002/0185260 | A1 * | 12/2002 | Calaman ................... | F28F 3/12 257/E23.098 |

(Continued)

*Primary Examiner* — Stephen S Sul
(74) *Attorney, Agent, or Firm* — SMITH TEMPEL; Steven P. Wigmore

(57) ABSTRACT

A system for providing direct silicon microfluidic cooling for electronics includes a cooling block with a first side and a second side. A plurality of micro-pin fins are disposed on the first side of the cooling block. A thermal interface material layer contacts a second side of the cooling block while a manifold is coupled to the cooling block and faces the micro-pin fins. The manifold has an inlet port and an outlet port for supporting cooling fluid flow between the inlet port and outlet port. The cooling fluid from the inlet port and outlet port also flows between the micro-pin fins for removing heat from the micro-pin fins absorbed by the cooling block from the thermal interface layer. The inlet port and outlet port each further comprise a cooling block port having a first geometry that corresponds with edges of a second geometry formed by the micro-pin fins.

13 Claims, 15 Drawing Sheets

(56) References Cited

U.S. PATENT DOCUMENTS

| | | | |
|---|---|---|---|
| 2006/0126308 A1* | 6/2006 | Campbell | H01L 23/3677 |
| | | | 257/E23.09 |
| 2008/0163631 A1* | 7/2008 | Campbell | G06F 1/20 |
| | | | 62/175 |
| 2008/0230208 A1* | 9/2008 | Rasmussen | F28F 13/00 |
| | | | 165/80.4 |
| 2009/0159244 A1* | 6/2009 | Mounioloux | G06F 1/20 |
| | | | 165/104.33 |
| 2014/0217870 A1* | 8/2014 | Wong | H05K 7/20309 |
| | | | 312/236 |
| 2014/0254098 A1* | 9/2014 | Arvelo | H01L 23/34 |
| | | | 361/699 |
| 2016/0118317 A1* | 4/2016 | Shedd | F28F 13/02 |
| | | | 257/712 |
| 2016/0345469 A1* | 11/2016 | Begolli | H05K 7/20772 |
| 2017/0287809 A1* | 10/2017 | Schultz | H01L 23/473 |
| 2020/0227341 A1* | 7/2020 | Neal | H01L 23/367 |
| 2020/0243418 A1* | 7/2020 | Neal | H01L 21/4882 |
| 2020/0305307 A1* | 9/2020 | Amos | H01L 23/3677 |
| 2021/0183741 A1* | 6/2021 | Jha | H01L 23/46 |
| 2021/0274690 A1* | 9/2021 | Cho | H05K 7/20927 |
| 2021/0360823 A1* | 11/2021 | Yoon | H05K 7/20327 |
| 2022/0015271 A1* | 1/2022 | De Sousa | H01L 23/473 |
| 2022/0354014 A1* | 11/2022 | Feurtado | H05K 1/0271 |

* cited by examiner

SYSTEM AND METHOD FOR PROVIDING DIRECT SILICON FOOTPRINT MICROFLUIDIC COOLING FOR ELECTRONICS

BACKGROUND

The microelectronics industry has been long-characterized by the constant shrinking of dimensions of processing components which support high speed computer applications run on computer systems. This trend has been closely captured in the evolution of semiconductor integrated circuits (ICs) during the last 50 years in accordance with Moore's law, which indicates that the number of components per integrated circuit doubles approximately every two years in this industry.

A higher density of processing components for any computing volume translates into a higher heat generation rate, and therefore, the development of more powerful, active cooling solutions has constantly been a topic of research and development. In addition to the increased density of electronic processing components, integrated circuits (ICs) also face increased demand for computing power due to software applications which may produce complex and rapid moving displays, such as those found in computer games.

In computer gaming, overclocking is a common practice where operators of computers need as much processing power as possible for the slightest advantage and edge to win and enjoy the games that are supported by their computers. Running these gaming systems' graphics that utilize graphics processing units (GPUs) and/or central processing units (CPUs) at rates faster than they were designed for may allow for higher performance, including rendering at higher frames per second with higher resolutions and texture details. But this extra processing load/demand usually generates a lot more heat and usually requires more cooling and heat removal from these key processing components.

Also, in addition to operators (i.e. "gamers") overclocking CPUs and/or GPUs to support games with complex and fast moving graphics, such CPUs and/or GPUs in the gaming environment are frequently operated for extended periods of time (i.e. beyond a "normal" eight-hour work day such as on the order of full twenty-four hour periods). Gainers play their computer games for these extended periods of time usually to advance to subsequent levels in a particular computer game.

Currently, conventional cooling systems for the general purpose computer incorporate heat pipes or indirect liquid cooling for the thermal management of high-power microelectronics.

All of such conventional cooling systems usually rely on the concept of using a heat spreading element to transfer away the heat generated by electronic components. Electronic components may comprise one or more processing components that support software applications running on a computer.

A heat spreading element may distribute heat energy over a larger footprint/area than that of the generating source (i.e. the silicon microprocessor having a smaller surface area relative to the heat spreading element, which is usually made of metal for conducting the heat). One reason why conventional cooling systems employ this heat spreading approach is due to the fact that removing the heat from a small footprint (usually between about 1.0 to about 4.0 square centimeters) is usually very challenging in terms of manufacturing enough surface area features for heat removal by convection over a small footprint.

Another problem for transferring heat away from processing components is that most electronic packaging environments usually have very constrained/tight/small volumes. To address such constrained/tight volumes of current electronic packaging environments, conventional cooling systems using heat spreading elements often calculate sizes of heat spreading elements using a heat spreading factor/variable. A heat spreading factor is usually the ratio between the surface area footprint of the heat transfer element (commonly referred to as contact plate, base plate or cold-plate) and the surface area footprint for the heat source (i.e. the silicon die).

Conventional cooling systems often utilize a heat spreading factor between about 4.0 and about 20.0. This means that the size of the surface area of a heat spreading element (i.e. the contact plate, base plate, or cold-plate) that is used to absorb heat of a silicon die is in the range of about 4.0 to about 20.0 times the actual surface area of the silicon die in order to provide an acceptable cooling rate.

However, these current art cooling systems suffer from heat transfer limitations. One fundamental heat transfer limitation is that whenever a planar-shaped heat spreading element is utilized, there is usually an associated thermal resistance due to the flow of heat in that plane of spreading. Due to such inherent thermal resistance of planar heat spreading elements, there are known limits of heat/temperatures at which the silicon micro-devices will fail.

In view of the numerous problems of conventional cooling systems described above, a need exists in the art for improved cooling systems capable of removing heat generated by silicon dies in a more efficient manner so that higher power inputs and increased clocking speeds may be achieved and sustained by processing components for long periods of time, such as, but not limited to, in computer gaming contexts. There is also a need for more compact/tighter volume cooling solutions at the chip level, which can allow for the integration of denser clustering of processing components to support more computer software applications and/or more robust computer software applications.

SUMMARY

A system and method for providing direct silicon footprint microfluidic cooling for electronic components includes a cooling block with micro-pin fins, a manifold with an inlet and outlet for supporting fluid flow, a thermal interface material layer, and an electronic component. The electronic component may be coupled to the thermal interface layer, while the thermal interface material layer is coupled to the cooling block.

The manifold is coupled to the cooling block and supports fluid flow across the cooling block. And specifically, the manifold supports fluid flow across the micro-pin fins that are part of the cooling block. The micro-pin fins absorb/transfer heat from a planar surface that is on the opposite of the cooling block side relative to the fin pins. The planar surface of the cooling block directly contacts the thermal interface material layer and receives heat from that layer.

The thermal interface material layer contacts the planar surface of the cooling block and a surface of the electronic component. The surface of the electronic component produces heat that is absorbed/transferred from the thermal interface material layer to the cooling block.

The electronic component may comprise a processing component. A processing component may include, but is not limited to, central processing units (CPUs), graphical processing units (GPUs), digital signal processors (DSPs), multi-core CPUs, field programmable gate arrays (FPGAs), and other similar integrated circuits (ICs) and/or systems on a chips (SOCs) that may support software applications running on a computer. The electronic component may comprise other elements besides processing components, such as operational amplifiers, modems, radio-frequency (RF) oscillators, resistors, inductors, capacitors, diodes, transistors, etc.

The system may further include a bracket subsystem which secures the manifold and cooling block against/indirect-contact-with the electronic component. The inlet and outlet of the manifold may be coupled to a piping subsystem. The piping subsystem may be coupled to a pump.

The pump may further include a reservoir for the fluid pumped through the piping subsystem and through the inlet and outlet of the manifold. The piping subsystem may further be coupled to a radiator subsystem. The radiator subsystem may further include air moving devices, such as a fan, that can be coupled to or positioned adjacent to the radiator.

Additional subsystems that include additional manifolds similar to the one described above maybe coupled to the piping subsystem. That is, two or more manifolds may be coupled to the piping subsystem in a fluidic series such that each manifold may provide improved microfluidic cooling to a single, and separate electronic device.

For example, a first manifold coupled to a single piping subsystem may provide microfluidic cooling for a first electronic component (i.e. a CPU). And a second manifold coupled to the same, single piping subsystem may provide microfluidic cooling for a second electronic component (i.e. a GPU), etc.

The pump, pump reservoir, radiator subsystem, and the fan may comprise existing off-the-shelf components available as of this writing and which will be described in detail below. The fluid moved by the pump within the piping subsystem preferably comprises distilled water. However, other fluids such as synthetic coolants, like ethylene-glycol-based radiator fluids, dielectric coolants, or super-cooled fluids, like liquid nitrogen may be employed without departing from this disclosure.

According to one exemplary embodiment, a system for providing direct silicon microfluidic cooling for electronics, may comprise: a cooling block comprising a first side and a second side, a plurality of micro-pin fins disposed on the first side of the cooling block. The system further includes a thermal interface material layer contacting a second side of the cooling block and a manifold coupled to the cooling block and facing the micro-pin fins, wherein the manifold comprises an inlet port and an outlet port for supporting cooling fluid flow between the inlet port and outlet port. The cooling fluid from the inlet port and outlet port may also flow between the micro-pin fins for removing heat from the micro-pin fins absorbed by the cooling block from the thermal interface layer.

The inlet port and outlet port each may further comprise a cooling block port having a first geometry that corresponds with edges of a second geometry formed by the micro-pin fins disposed on the first side of the cooling block. According to one exemplary embodiment, each cooling block port has a rectangular geometry to correspond with a square or rectangular second geometry formed by the surface area occupied by the micro-pin fins.

The system may further comprise a gasket that encloses the micro-pin fins and forms a fluid-tight seal. Meanwhile, the thermal interface layer may also contact an electronic component.

According to another exemplary embodiment, a system for providing direct silicon microfluidic cooling for electronics, may comprise: a cooling block comprising a first side and a second side; a plurality of micro-pin fins disposed on the first side of the cooling block; and a thermal interface material layer contacting a second side of the cooling block, the thermal interface material layer also contacting a heat producing surface. The system may further include a manifold coupled to the cooling block and facing the micro-pin fins, wherein the manifold comprises an inlet port and an outlet port for supporting cooling fluid flow between the inlet port and outlet port.

The cooling fluid from the inlet port and outlet port may also flow between the micro-pin fins for removing heat from the micro-pin fins absorbed by the cooling block from the thermal interface layer. The system may further include means for holding the manifold against the heat producing surface.

The inlet port and outlet port may each further comprise a cooling block port having a first geometry that corresponds with edges of a second geometry formed by the micro-pin fins disposed on the first side of the cooling block. The first geometry may comprise a rectangular shape while the second geometry may comprise a rectangular shape or a square shape.

The means for holding may comprise at least one type of fastener, like a bolt or a screw, or a rivet. The heat producing surface may comprise at least one of a: central processing unit (CPU), a graphical processing unit (GPU), a digital signal processors (DSP), a multi-core CPU, a field programmable gate arrays (FPGA), an integrated circuits (IC), a system on a chips (SOC), an operational amplifier, a modem, a radio-frequency (RF) oscillator, a resistor, an inductor, a capacitor, a diode, and a transistor.

According to another exemplary embodiment, a system for providing direct silicon microfluidic cooling for electronics may comprise: a cooling block comprising a first side and a second side; a plurality of micro-pin fins disposed on the first side of the cooling block; and a thermal interface material layer contacting a second side of the cooling block.

The thermal interface material layer may also contact a heat producing surface; and a manifold may be coupled to the cooling block and may face the micro-pin fins, wherein the manifold comprises an inlet port and an outlet port for supporting cooling fluid flow between the inlet port and outlet port. The cooling fluid from the inlet port and outlet port may also flow between the micro-pin fins for removing heat from the micro-pin fin absorbed by the cooling block from the thermal interface layer.

The system may further have a device for holding the manifold against the heat producing surface. The device for holding may comprise a fastener. The fastener may comprise at least one of a screw, rivet, bolt, nut, and an adhesive.

According to a further exemplary embodiment, a method for providing direct silicon microfluidic cooling for electronics may comprise: determining a surface area of the electronic component or surface to be cooled. Next, a cooling block may be created matching the surface area of the electronic component, including: creating a micro-pin fin surface on one side of the cooling block which matches/corresponds with the surface area of the electronic component.

Next, a manifold is created that corresponds to the dimensions of the micro-pin fin surface area on the cooling block. Inlet and outlet ports are created in the manifold such that the ports are provided with apertures that have a geometry which align with the edges of the geometry of the micro-pin fin surface area in order to promote efficient fluid flow across the micro-pin fin surface area during cooling. Next, the manifold may be coupled to the cooling block having the micro-pin fin surface area. The cooling block may then be coupled to the electronic component with a thermal interface material (TIM) layer.

The manifold may then be coupled to the printed circuit board (i.e. motherboard) containing the electronic component which is to be cooled. Subsequently, fluid lines for supporting cooling fluid flow may be coupled to the manifold. Cooling fluid may then be pumped through the fluid lines/conduits. Heat is then removed from the fluid when it flows thorough a radiator, which may have a fan to pull ambient air across the radiator.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

DETAILED DESCRIPTION OF EXEMPLARY EMBODIMENTS

The word "exemplary" is used herein to mean "serving as an example, instance, or illustration." Any aspect described herein as "exemplary" is not necessarily to be construed as exclusive, preferred or advantageous over other aspects.

Figure 1:
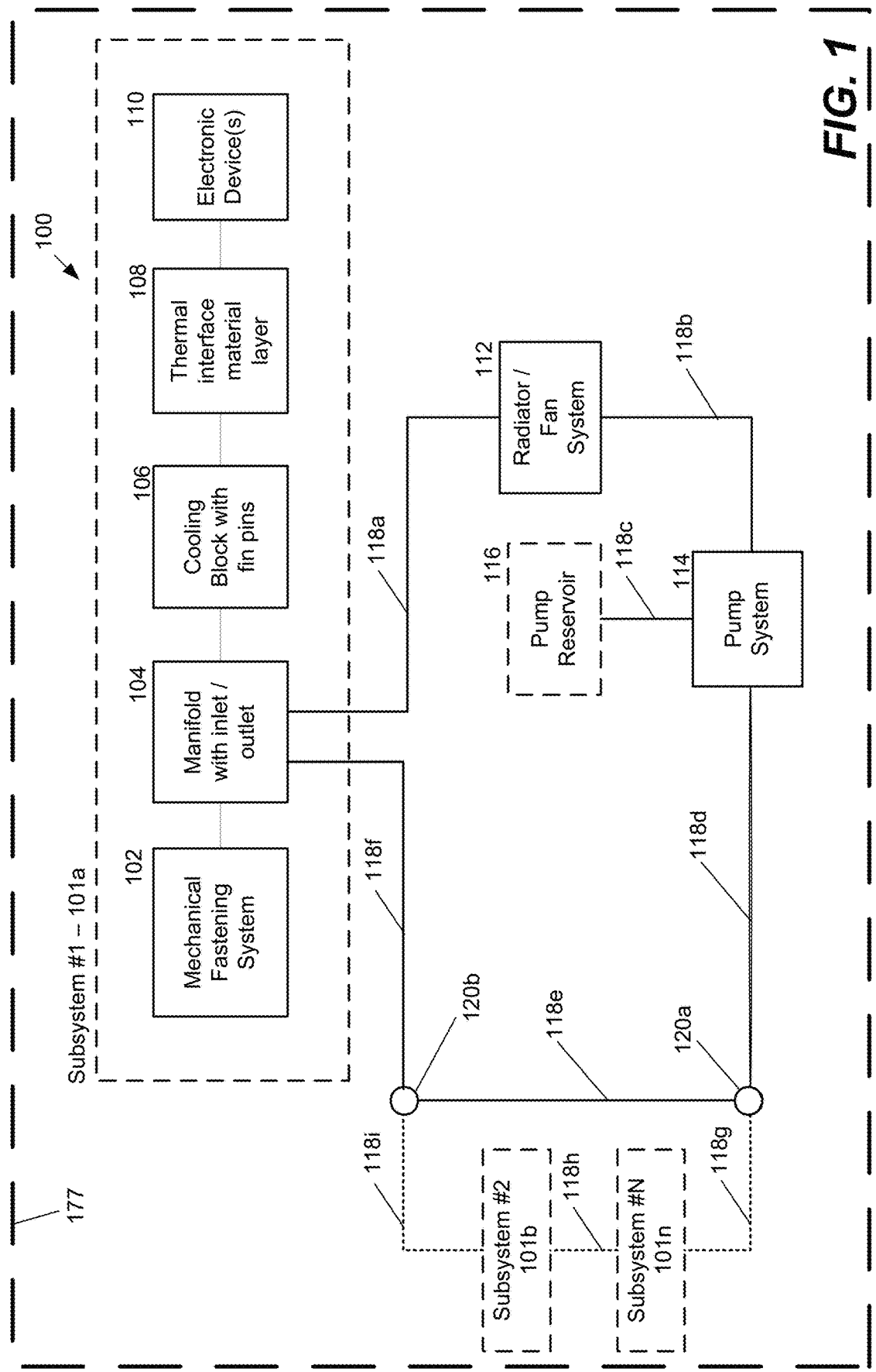
FIG. 1 is a functional block diagram which illustrates several components of a system and method for providing direct silicon footprint microfluidic cooling for electronic components according to one exemplary embodiment.

Referring now to FIG. 1, this figure illustrates several components of a system 100 and method for providing direct silicon footprint microfluidic cooling for electronic components 110. The system may comprise a mechanical fastening system 102, a manifold 104 with a fluid inlet and a fluid outlet, a cooling block 106 with micro-pin fins 206 (see FIG. 2 for pins 206), and a thermal interface material layer 108. The thermal interface material layer 108 may be directly coupled/in contact with the electronic component 110.

As noted above, the electronic component may comprise a processing component. A processing component may include, but is not limited to, central processing units (CPUs), graphical processing units (GPUs), digital signal processors (DSPs), multi-core CPUs, field programmable gate arrays (FPGAs), and other similar integrated circuits (ICs) and/or systems on a chips (SOCs) that may support software applications running on a computer. The electronic component may comprise other elements besides processing components, such as operational amplifiers, modems, radio-frequency (RF) oscillators, resistors, inductors, capacitors, diodes, transistors, etc.

The thermal interface material (TIM) layer 108 may comprise anyone or a combination of materials. Exemplary materials include, but are not limited to, thermal grease, thermal adhesives, thermal gap fillers, a thermally conductive pad that may include silicon or silicon-like materials, thermal tapes, Phase-change materials (PCM), Metal thermal interface materials (such as liquid gallium or indium foils), and other similar heat-conducting type materials.

According to one exemplary embodiment, the TIM layer 108 may include a material branded as CONDUCTONAUT™ sold by Thermal Grizzly, known as of this writing. It is understood that this CONDUCTONAUT™ brand material comprises a gallium-based liquid (commercially referred to as "a liquid metal"). However, other materials are possible as described above. TIM layer 108 generally is spread over the entire surface of the electronic component 110. The TIM layer 108 couples to and is in direct contact with the cooling block 106 as will be described below.

The TIM layer 108 usually has a thickness between about 0.001 mm and 1.00 mm, and preferably, between about 0.005 mm and 0.03 mm. However, other magnitudes greater or smaller than these ranges are possible and are included within the scope of this disclosure.

These elements 102, 104, 106, 108, and 110 contained within the first dashed rectangular box may form a first subsystem 101a within the main system 100. That is, the main system 100 may comprise a plurality of subsystems 101b, 101n, that are all coupled together by conduits 118. The conduits 118 may support fluid flow between each of the subsystems 101a, 101b, and 101n. The system 100 may comprise a single subsystem 101a or a plurality of subsystems 101b, 101n.

Generally, each subsystem, like subsystem 101a, is coupled to the conduits 118 via the manifold 104 of each subsystem 101. Each manifold has a fluid inlet 202a and a fluid outlet 202b (see FIG. 2). The conduits 118 may comprise metal, glass, plastic, composite materials, or any combination of materials thereof. As noted previously, according to one exemplary and preferred embodiment, the cooling fluid may comprise distilled water. However, other cooling fluids are possible. Other cooling fluids include, but are not limited to, ethylene-glycol-based radiator fluids, or super-cooled fluids, like liquid nitrogen, may be employed without departing from this disclosure.

The second Subsystem #2-101b and the Nth Subsystem #N-101n are illustrated with dashed lines to indicate that they are optional. Each subsystem 101 may be coupled to the conduits 118 via couplers 120 that may include T-joints, Y-connections and/or other similar conduit coupling mechanisms. The second Subsystem #2-101b and the Nth Subsystem #N-101n are illustrated in FIG. 1 to be connected with conduits/fluid lines 118 in series, but parallel connections are possible and are included within the scope of this disclosure. Preferably, the conduits 118 are off-the-shelf components. However, custom-built conduits 118 may be made without departing from the scope of this disclosure.

Each manifold 104 which has an inlet port 202a and outlet port 202b (see FIG. 2 described below) is coupled to the conduits 118. The conduits 118 are also coupled to a radiator/fan system 112 and a pump system 114. The pump system 114 may be coupled to a pump reservoir 116 if the system 114 is an "open" system in which additional cooling fluid may be added on a periodic basis.

The pump reservoir 116 may store excess cooling fluid, such as water, and can be filled when running low and if it is an "open" system 114. The pump reservoir 116 is illustrated with dashed lines to indicate that it is also optional. According to other exemplary embodiments, the pump system 114 and conduits 118 may be a "closed" or permanently sealed system. In such embodiments, the pump reservoir 116 would usually not be needed as understood by one of ordinary skill in the art.

The radiator/fan system 112 may comprise a radiator and a fan that pulls or pushes air across the radiator. Off-the-shelf radiator/fan systems 112 may be employed. For example, one radiator/fan system 112 is sold by Hardware Labs Performance Systems, Inc. under the brand name of BLACK ICE™, known as of this writing. Similarly, the pump system 114 may comprise off-the-shelf products, such as D5 LOWARA™ brand water pumps sold by Xylem Inc., known as of this writing. According to one exemplary embodiment, the pump system 114 may provide cooling fluid flow rates of between about 100.0 and about 1500.0 liters per hour (LPH). However, other fluid flow rates are possible and are within the scope of this disclosure.

The system 100 is usually contained within some form of electronic packaging housing 177. For example, the electronic packaging housing 177 may comprise the mechanical housing/frame/container of a desktop computer or a housing of a computer server. However, other housings smaller or larger are possible and are included within the scope of this disclosure.

Figure 2:
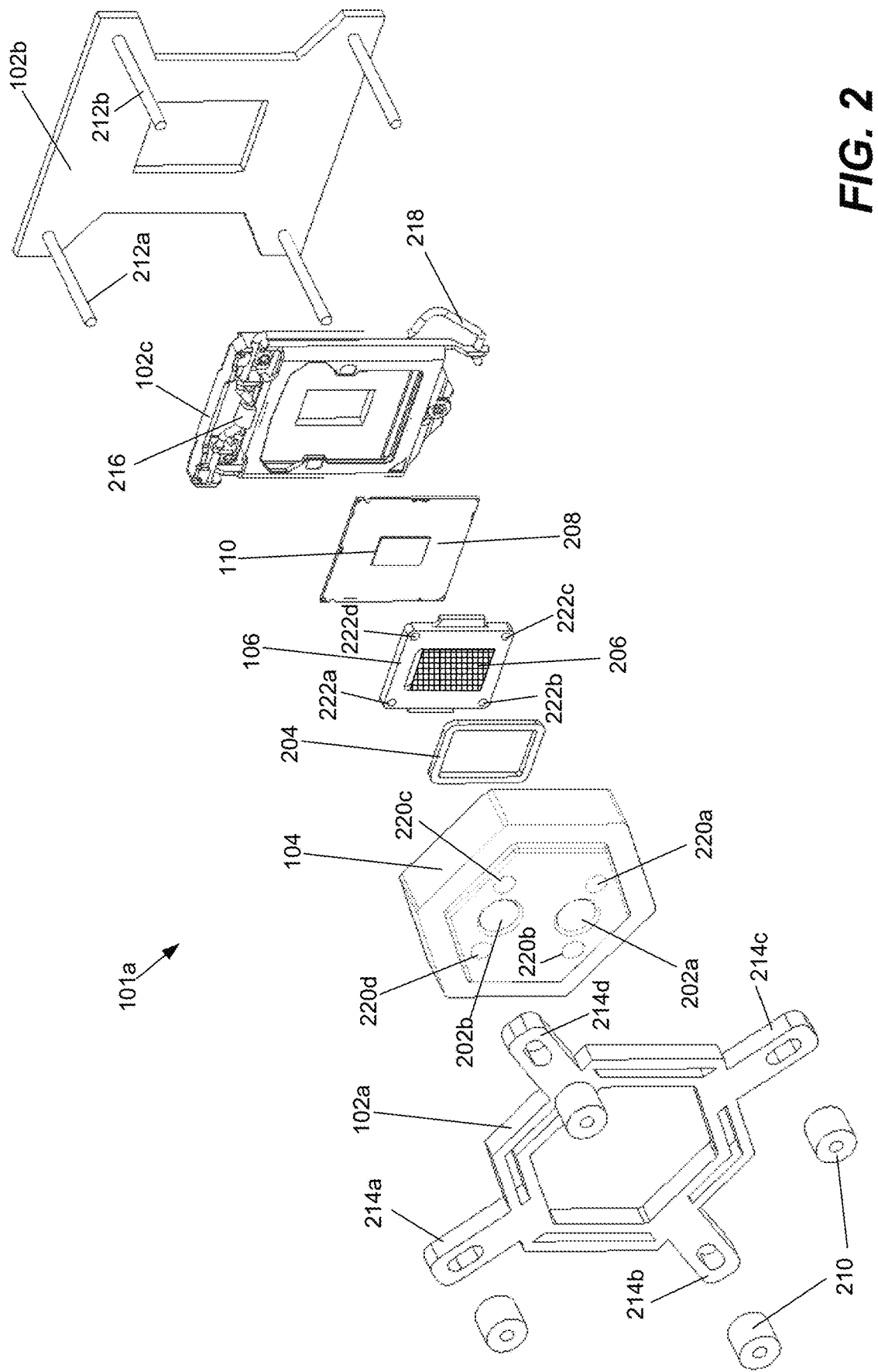
FIG. 2 illustrates the physical components of one exemplary embodiment of an exploded view of the first cooling subsystem #1 illustrated in the functional block diagram of FIG. 1.

Referring now to FIG. 2, this figure illustrates the physical components of one exemplary embodiment of an exploded view of the subsystem #1-101a illustrated in the functional block diagram of FIG. 1. Further details of the mechanical fastening system 102 are illustrated in FIG. 2. The fastening system 102 may comprise a first fastening plate 102a and a second fastening plate 102b. According to one exemplary embodiment, the first fastening plate 102 has a frame with a hexagonal shape that has four arms 214a-d extending from that frame. The first fastening plate 102a may have other shapes besides a hexagon as long as the shape provides a secure connection and complies with "standard" circuit board holes for cooling hardware.

That is, the mechanical fastening system 102 is designed based on the "standard" hole spacing for cooling systems from commercial printed circuit boards (PCBs) 208, i.e. "motherboards." The fastening system 102 provides a regulated mounting pressure so the electronic component 110 has substantially flat/even contact surface with cooling block 106, and specifically, a rear substantially planar face of the cooling block 106, where the micro-pin fins 206 are positioned on the opposite side of that rear planar face of block 106. Thus, in line with "standard" hole spacings of PCBs 208 or CPU sockets 102c (described below), other shapes for the fastening system 102 may include, but are not limited to, triangular, square, rectangular, pentagonal, octagonal, elliptical, round, etc.

The second fastening plate 102b may also have a unique geometry that may be different than the first fastening plate 102a. The second fastening plate 102b is usually shaped to compliment a side of a circuit board and/or electronic packaging socket 102c that it may face. The second fastening plate 102 usually has projections 212, here cylindrical rods illustrated in FIG. 2, which engage the four arms 214a-d of the first fastening plate 102a. The projections 212 of the second fastening plate 102b may be coupled/fastened to apertures in the arms 214a-d of the first fastening plate 102a with coupling devices, such as threaded nuts/bolts 210 with coupled springs (not illustrated) for mounting pressure regulation. Nuts 210 with springs (not illustrated) allow regulation of the mounting pressure such that the pressure/force applied is substantially even across all four corners of a four-bolt/nut mounting system.

However, other fastening systems 102 are possible and are included within the scope of this disclosure. Other fastening systems 102 include just adhesives used between the components shown in FIG. 2 or other fastening type devices, like rivets, screws, pins, etc. as understood by one of ordinary skill in the art.

Further details of the manifold 104 are also visible in FIG. 2. An inlet fluid port 202a and an outlet fluid port 202b are now visible in FIG. 2. Further, a fluid gasket 204 that couples around the bottom of the inlet and outlet ports 202 of the manifold 104 is also visible. The fluid gasket 204 insures that a tight and leak-proof coupling exists between the manifold 104 and the cooling block 106 which has micro-pin fins 206. The micro-pin fins 206 are in fluid communication with the cooling fluid that flows into and out of the manifold 104 as will be described below and illustrated in FIGS. 8-9.

The manifold 104 has a hexagonal shape geometry, like that of the first fastening plate 102a. However, other geometries, for the manifold 104 are possible and are included within the scope of this disclosure. Like the fastening plates 102, other shapes for the manifold include, but are not limited to, triangular, square, rectangular, pentagonal, octagonal, elliptical, round, etc.

Disposed on the manifold 104 are additional apertures 220a-d relative to the inlet and outlet ports 202a, 202b. The additional apertures 220a-d may receive mechanical fasteners (not shown) which penetrate completely through the cross-section of the manifold 104 such that the fasteners engage apertures 222a-d disposed in the cooling block 106 having the fin pins 206.

The fasteners (not shown) penetrating the apertures 220a-220d and 222a-d couple the manifold 104, gasket 204, and cooling block 206 tightly and firmly together such that a liquid-tight seal is formed between these members so that fluid entering the inlet port 202a may flow through the manifold 104 and across the fin pins 206 and then out the outlet port 202b (or vice-versa with respect to cooling-fluid flow direction). The junction between the each fluid port 202 of the manifold 104 and the edges of the cooling block 106, and specifically, the edges of the plane having the fin pins 206 is important and will be described in further detail below. See FIGS. 7-9 described in further detail below and which address the fluid flow from the ports 202 in the manifold and across the geometrical plane which has the fin pins 206.

Figure 5:
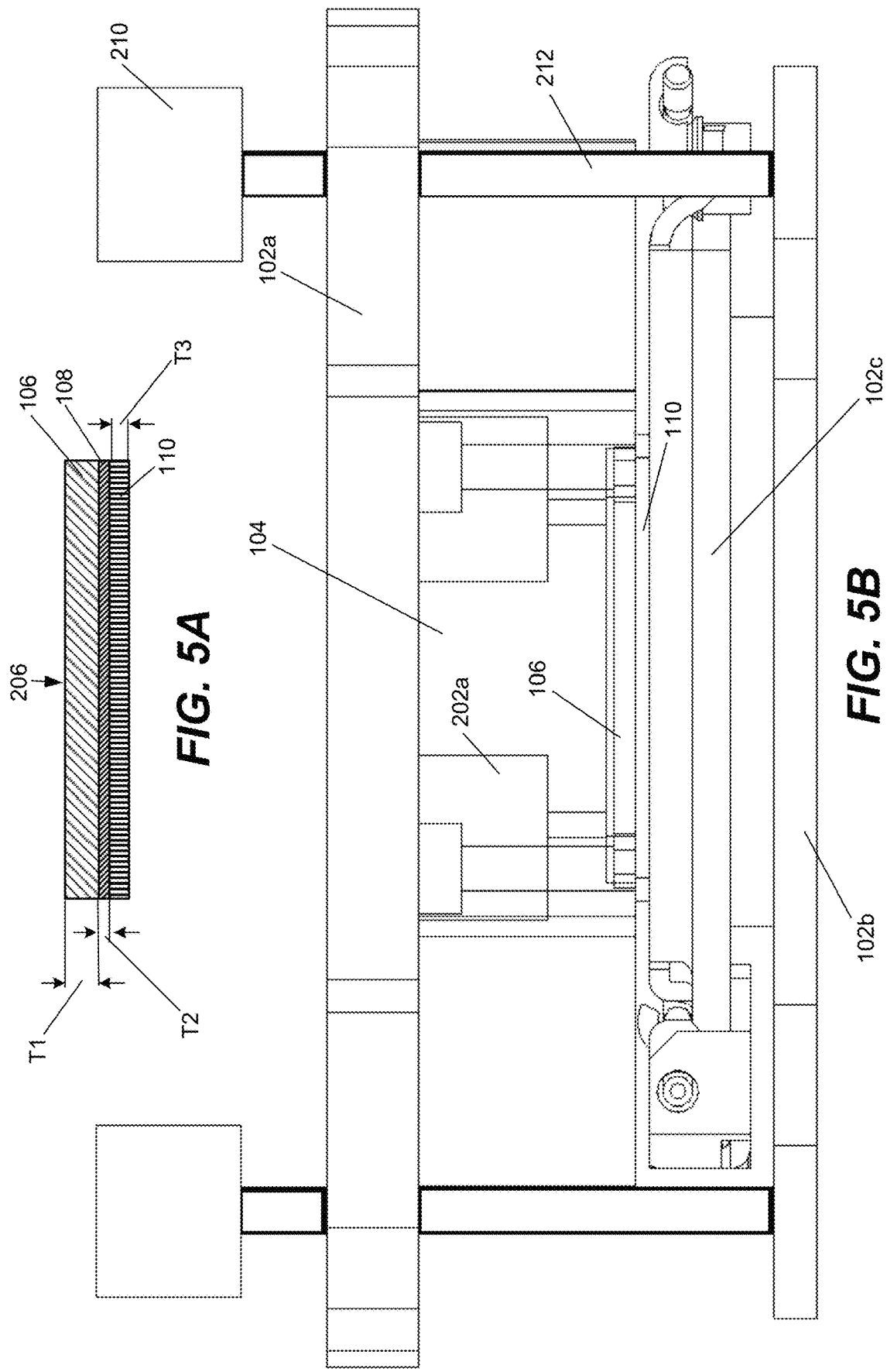
FIG. 5A illustrates a cross-sectional view of the cooling block, which has the micro-pin fins (not shown) on its fluid facing surface, and cross-sectional views of the thermal interface material (TIM) layer and the electronic component.
FIG. 5B illustrates a side view of the first subsystem #1 of FIG. 4 according to one exemplary embodiment.

What is not illustrated in FIG. 2 is the TIM layer 108. However, this TIM layer 108 is clearly visible in the cross-sectional view of FIG. 5A described in further detail below. However, the electronic component 110 is visible in FIG. 2 and it is shown to be residing on a printed circuit board (PCB) 208. The PCB 208 may comprise traces/connections as well as additional electronic components (not visible in FIG. 2).

Fastening structure 102c is known in the art as a central processing unit (CPU) socket. Socket 102c may be part of a motherboard and it may provide electrical connections between the PCB 208 containing the CPU/electronic component 110 and a motherboard (not shown). Element 216 of CPU socket 102c may comprise a hinge that allows placing the electronic component 110 in the socket and then be fastened by a securing lever 218 into a retained/secured position. This socket 102c is just an example of an additional support structure for the electronic component 110 and is commercially used as of this writing by companies, such as INTEL™, a computer chip manufacturer known as of this writing throughout the world. The socket 102c may be referred to in the industry as a land grid array (LGA) type socket. However, other electronic packaging industry standard sockets are possible and are included within the scope of this disclosure.

Figure 3:
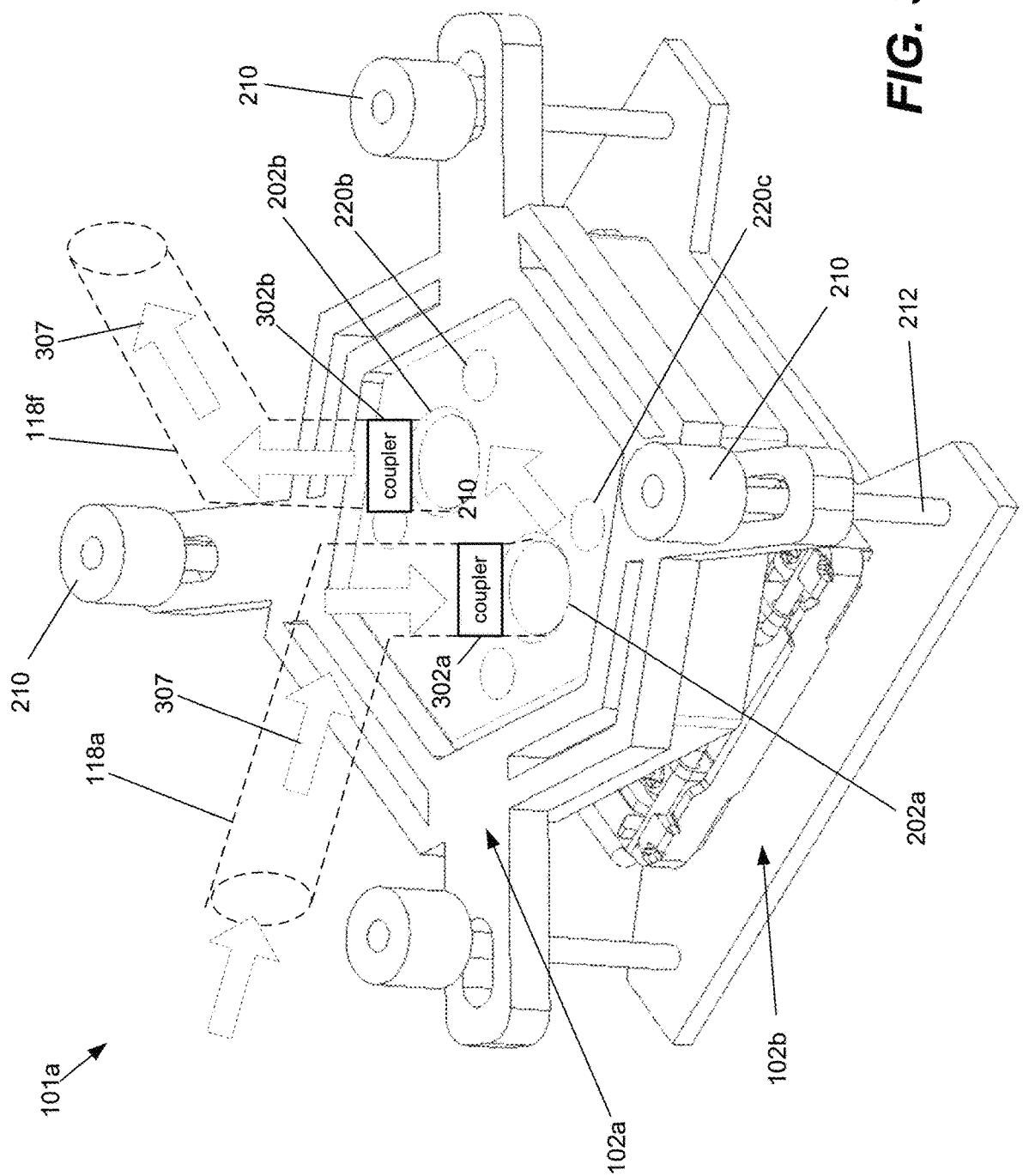
FIG. 3 illustrates a side isometric/perspective view of an assembled state of the cooling first subsystem #1 illustrated in FIG. 2.

Referring now to FIG. 3, this figure illustrates a side perspective view of an assembled state of the cooling first subsystem #1-101a illustrated in FIG. 2. In this figure, two conduits 118a, 118f are visible. A first conduit 118a is coupled to the inlet 202a of the manifold 104 with a first coupler 302a. This first conduit 118a carries cooling fluid indicated by flow arrow 307 towards the inlet 202a. A second conduit 118f is coupled to the outlet 202b of the manifold 104 with a second coupler 302b. This second conduit 118f carries cooling fluid indicated by flow arrow 307 away from outlet 202b. Conduits 118a, 118f generally correspond with the conduits 118 of FIG. 1, however, fluid flows may be reversed as shown without departing from the scope of this disclosure.

Each coupler 302 may comprise a standard fluid coupling such as SCG™ fluid couplers sold by the company, STAUBLI, known as of this writing. Each port 202 of manifold 104 may be threaded so that threaded couplers/fittings 302 may engage each port 202 by threading the respective parts together. However, other couplings/connections are possible besides threaded couplers 302 and are within the scope of disclosure as understood by one of ordinary skill in the art.

As noted previously, the conduits 118 in combination with the pump system 114 and radiator/fan system 112 may provide cooling fluid flow rates of between about 100.0 and about 1500.0 liters per hour (LPH). This translates into heat removal rates of up to about 500.0 Watts per hour.

As one example of an electronic component 110 sold "off-the-shelf" as of this writing and used with system 100, a CPU manufactured by Intel (for gaming) as of this writing, is model Core i9-9900K, (silicon chip surface area of about 200 $mm^2$) This component 110 may produce a heat footprint of up to about 250.0 Watts when it is overclocked. This heat footprint has been easily handled by system 100.

As an example of graphics processing unit (GPU) or also referred to as a graphics card chip that has been used with system 100, a GPU manufactured by nVIDIA having the brand/model no. RTX 2080Ti has been cooled with system 100. This electronic component 110 may generate between about 300.0 W and about 500.0 W when it is overclocked. The component 110 has a silicon chip surface area of about 750 $mm^2$.

The system 100 allows the removal of more heat at lower temperatures. The system 100 usually replaces/removes heat spreaders for CPUs 110 which have the spreaders built-in/coupled to the CPUs 110.

Figure 4:
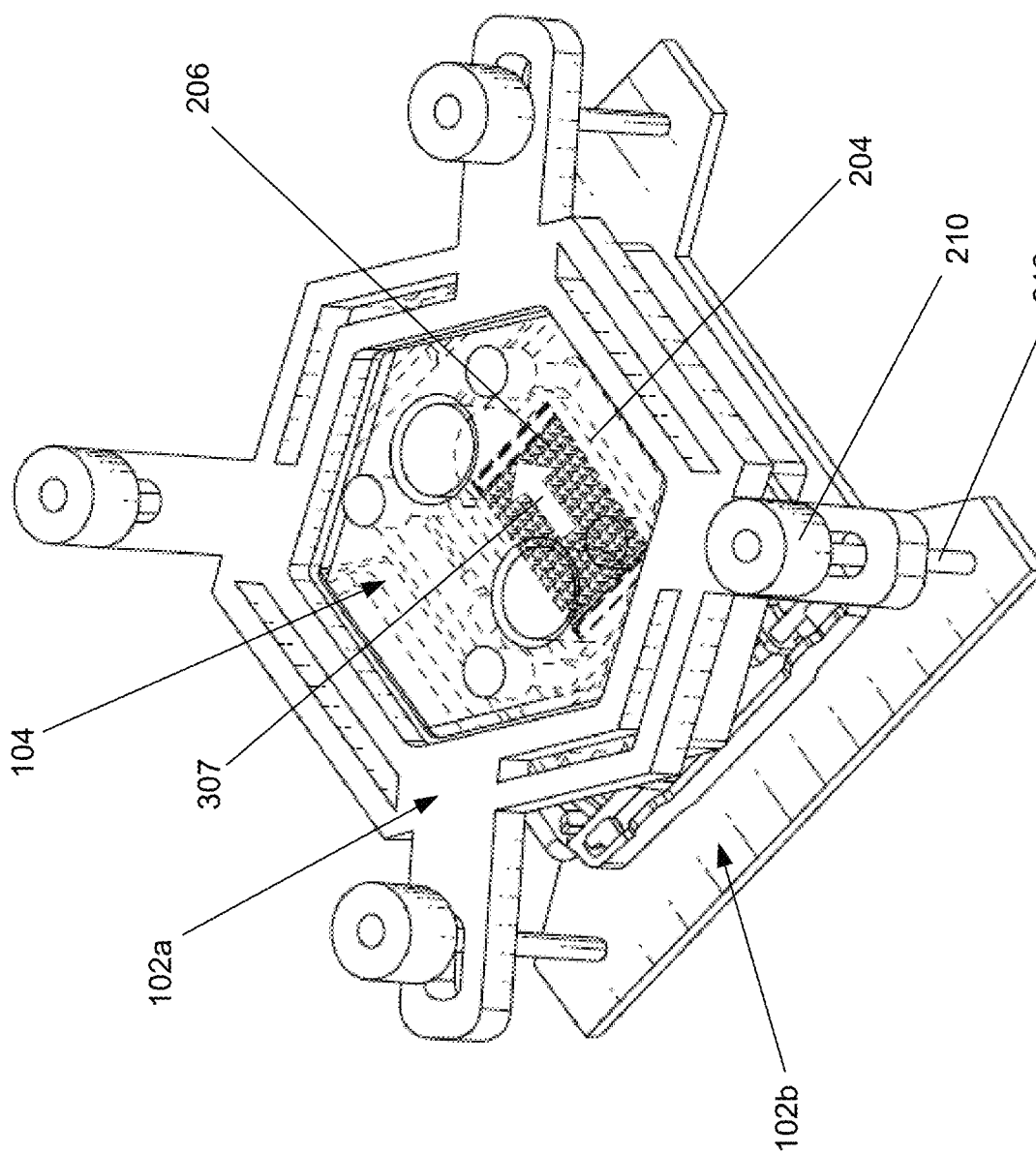
FIG. 4 illustrates a side perspective/isometric view similar to that of FIG. 3 of the first subsystem #1, but the manifold has been illustrated/represented as being made from clear plastic materials so that the micro-pin fins and gasket are visible.

Referring now to FIG. 4, this figure illustrates a side perspective/isometric view similar to FIG. 3 of the first subsystem #1, but the manifold 104 has been illustrated/represented as being made from clear plastic materials so that the micro-pin fins 206 and gasket 204 are visible. A small fluid flow arrow 307 is also depicted with dashed lines to indicate the flow of cooling fluid across the surface which has the micro-pin fins 206. Further details of this cooling fluid flow 307 across the micro-pin fins 206 will be described in further detail below in connection with FIGS. 8-9.

Referring now to FIG. 5A, this figure illustrates a cross-sectional view of the cooling block 106, which has the micro-pin fins 206 (not visible in this view) on the fluid facing surface, and cross-sectional views of the thermal interface material (TIM) layer 108 and the electronic component 110. The cooling block 106 generally has a thickness dimension T1 that is between about 0.50 and about 4.00 mm. Meanwhile, as noted above, the TIM layer 108 has a thickness dimension T2 between about 0.001 mm and 1.00 mm, and preferably, between about 0.005 mm and 0.03 mm.

The electronic component 110 has a thickness dimension T3 that is between about 0.10 mm and about 1.00 mm. However, other ranges for these thicknesses T1, T2, and T3 are possible and are included within the scope of this disclosure. And generally, the relationship between the thicknesses of the cooling block 106, the thermal interface material (TIM) layer 108, and electronic component 110, for most applications/use-cases will be as follows: T1 [cooling block 106]>T3 [electronic component]>T2 [TIM layer 108].

This means T1 is generally always greater than T3 and T2. And it follows, that T3 is usually always greater than T2 as illustrated by the relative thicknesses shown in FIG. 5A.

The cross-section for the cooling block 106 has been shaded as a metal. According to one exemplary embodiment, the metal for the cooling block is preferably copper. And the micro-pin fins 206 (not shown) are created from this metal However, other metals are possible and are included within the scope of this disclosure. Other metals include, but are not limited to, aluminum, brass, stainless steel, or metal alloys. And non-metals can also be used such as, but not limited to, silicon, silicon-carbide, graphene, polymer composites, and other composite materials.

Similarly, the cross-section for the TIM layer 108 has been shaded as a metal, since it may contain metals and may behave as a metal with respect to transferring heat from the electronic component 110. And the cross-section of the electronic component 110 has been shaded as a synthetic material, where the electronic component 110 is usually made out of silicon and/or other combinations of materials as understood by one of ordinary skill in the art.

Referring now to FIG. 5B, this figure is a side view of the first subsystem #1 of FIG. 4. Unlike FIG. 5A, the TIM layer 108 is not visible in FIG. 5B because this layer is so small compared to the thicknesses of the cooling block 106 and the electronic component 110. This FIG. 5B demonstrates how the mechanical fasteners 210, 212 provide proper compression forces so that the fastening system 102 that includes first and second fastening plates 102a, 102b insures that the cooling block 106 stays in firm and direct contact with the electronic component 110.

Figure 6:
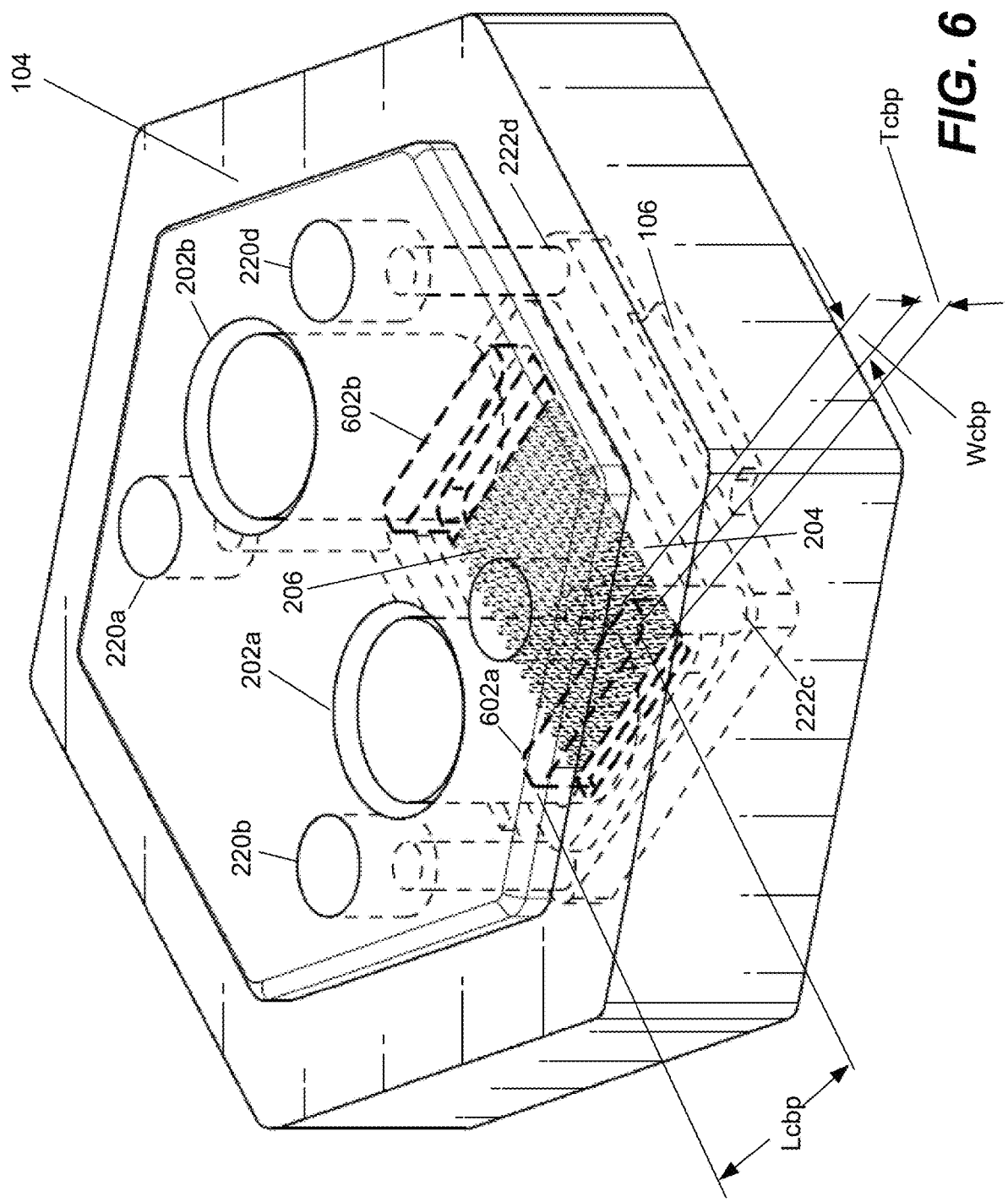
FIG. 6 illustrates a side perspective view of the manifold 104 and some important details about the manifold shown in phantom/with dashed lines.

Referring now to FIG. 6, this figure illustrates a side perspective view of the manifold 104 and some important details about the manifold shown in phantom/with dashed lines. Further details of apertures 220 are shown where the apertures 220 may comprise a counterbored hole for receiving fasteners (not shown) that engage with the apertures 222 of the cooling block 106. According to one exemplary embodiment, the apertures 222 of the cooling block 106 may comprise threads so that fasteners comprising screws can be used to secure the manifold 104 against the cooling block and the gasket 204. Other fasteners besides screws can be used to secure the manifold 104 against the cooling block 106 as understood by one of ordinary skill of art. For examples, rivets, bolts, etc. may be employed.

Further, apertures 220 without counterbores are possible and are included within the scope of this disclosure. Similar to apertures 222 which may comprise threads for receiving threaded fasteners not shown, inlet and outlet ports 202 may also comprise threads for receiving threaded couplers 302 as described above. However, couplers 302 without threads are possible and are included within the scope of this disclosure.

One important feature illustrated in FIG. 6 are two cooling block ports 602a, 602b which are positioned below each inlet and outlet port 202a, 202b. That is, the surface of the manifold 104 which faces the cooling block 106 and contacts the gasket 204 includes two cooling block ports 602a, 602b. According to one exemplary embodiment, these cooling block ports 602a, 602b may comprise a rectangular geometry.

However, other geometries for the cooling block ports 602 are possible, and are included within the scope of this disclosure. Other geometries for the cooling block ports 602 include, but are not limited to, square, oval, circular, elliptical, triangular. These cooling block ports 602 facilitate substantially even distribution of cooling fluid flow across the micro-pin fins 206 of the cooling block 106. Usually, the geometry of the cooling block ports 602 corresponds to the geometry of the space occupied by the micro-pin fins 206. That is, since the edges of the space occupied by the micro-pin fins 206 are rectangular in shape, then the cooling block ports 602 have a corresponding geometry which is rectangular.

However, if the edges of the space occupied by the micro-pin fins 206 were a different shape, such as the bottom half of a hexagonal shape, then the cooling block ports 602 would usually have a corresponding shape to facilitate fluid flow across the micro-pin fins 206. Such a corresponding shape/geometry for the cooling block ports 602 would comprise a half of a hexagonal shape. Further operations and/or functions of the cooling block ports 602 will be described below in connection with FIGS. 7-9.

According to the exemplary rectangular embodiment illustrated in FIG. 6, each cooling block port 602 may comprise a length dimension Lcbp, a width dimension Wcbp, and a thickness dimension Tcbp. The length dimension Lcbp generally corresponds with the length dimension of the surface occupied by the micro-pin fins 206. The length dimension Lcbp of the cooling block port (cbp) 602 of FIG. 6 may comprise a magnitude between about 5.0 mm and 50.0 mm.

The width dimension Wcbp of the cooling block port (cbp) 602 of FIG. 6 may comprise a magnitude between about 0.5 mm and 5.0 mm. The thickness dimension Tcbp of the cooling block port 602 of FIG. 6 may comprise a magnitude between about 0.5 mm and 10.0 mm. However, other dimensions smaller or larger are possible and are included within the scope of this disclosure.

Figure 7:
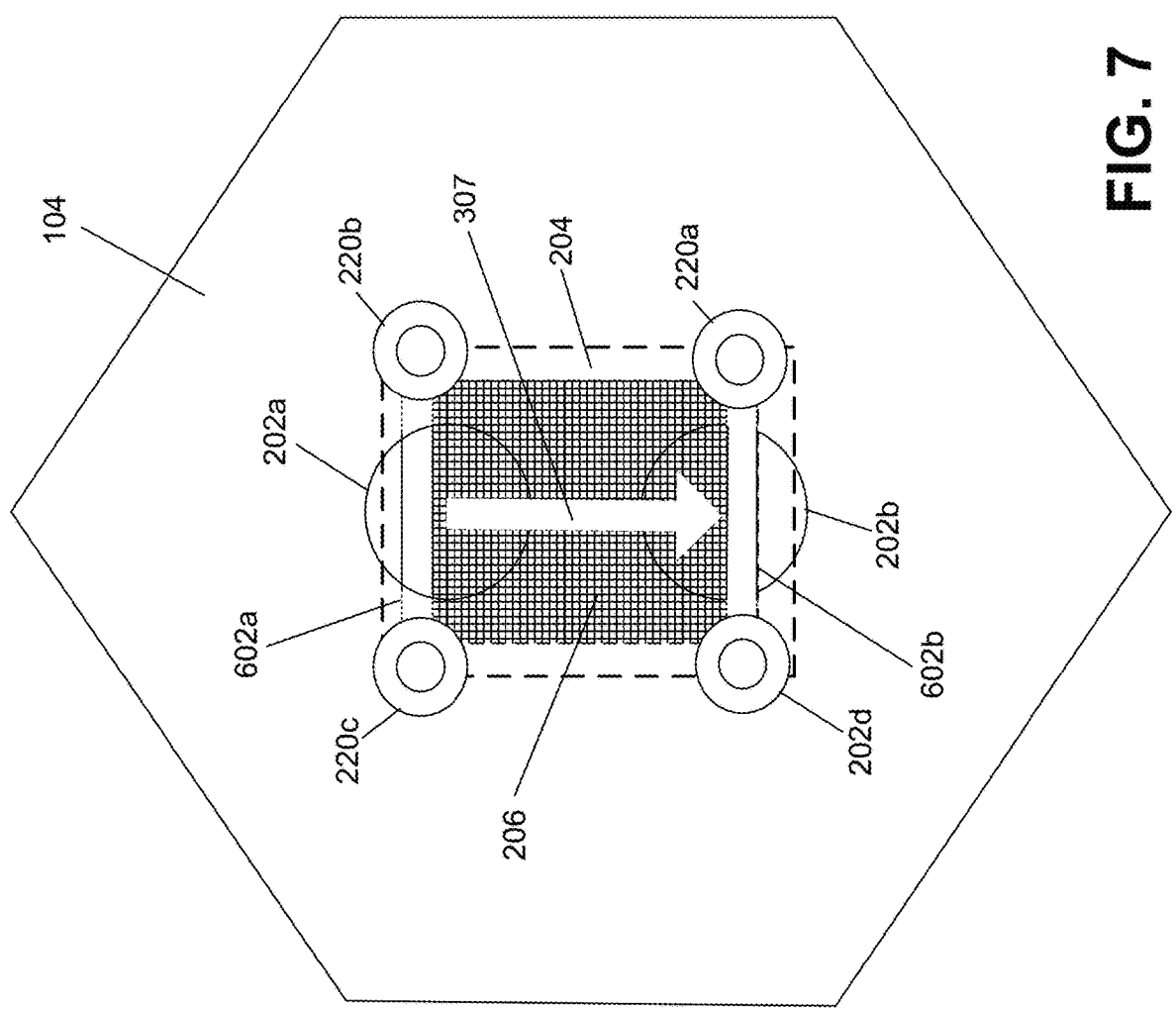
FIG. 7 illustrates a top view of the manifold and cooling block with the micro-pin fins.

Referring now to FIG. 7, this figure is a top view of the manifold 104 and cooling block 106 with the micro-pin fins 206. Cooling fluid flow arrow 307 shows how fluid enters the inlet port 202a and exits the cooling block port 602a and flows across the micro-pin fins 206. The fluid then enters the cooling block port 602b and then exits out the outlet port 202b. The gasket 204 is illustrated with dashed lines.

Figure 8:
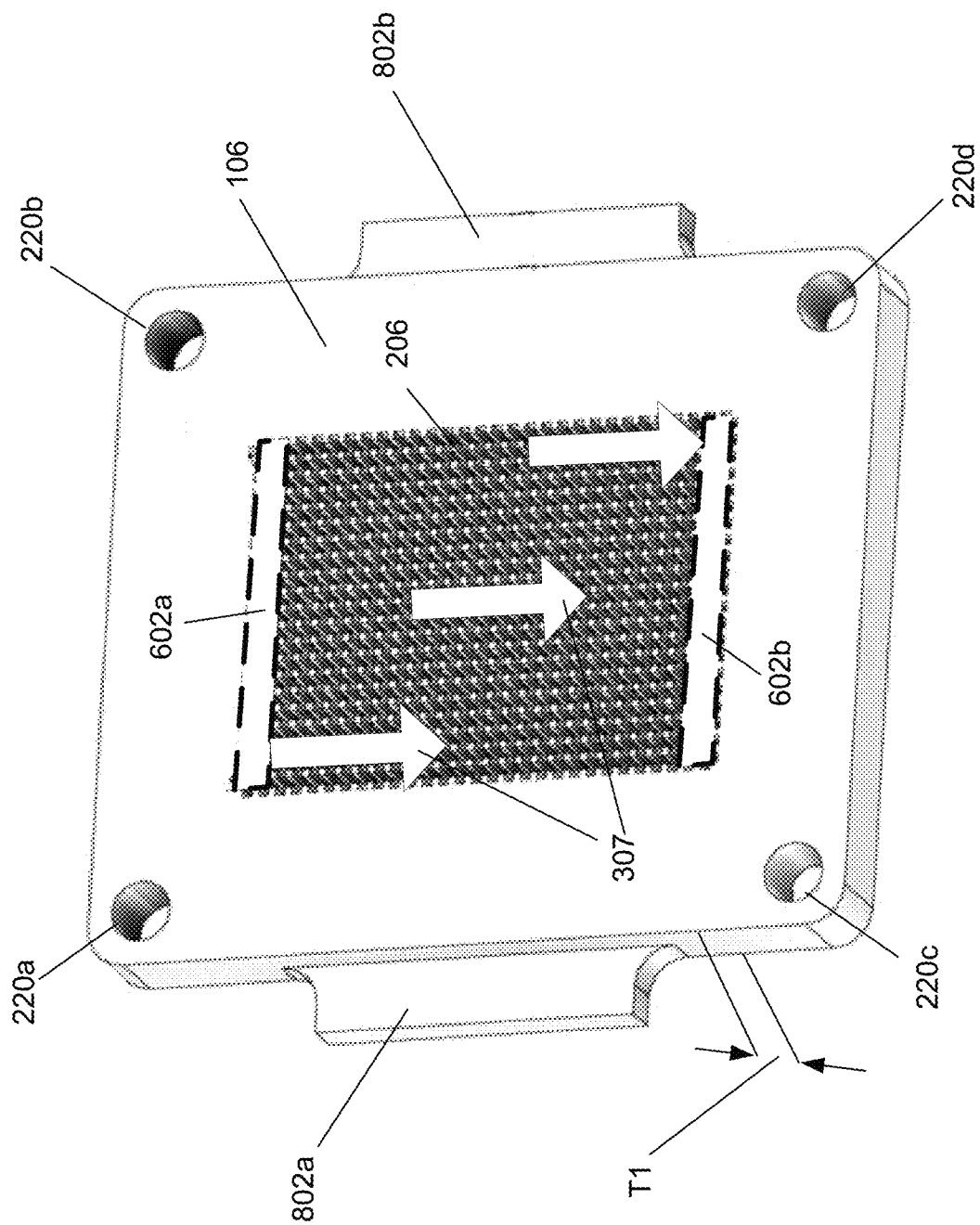
FIG. 8 illustrates an isometric view of the cooling block which has micro-pin fins.

Referring now to FIG. 8, this figure illustrates an isometric view of the cooling block 106 which has micro-pin fins 206. As noted previously, the cooling block 106 has apertures 220 which may be threaded to receive fasteners (not shown) that may include screws. Also, described above, the cooling block 106 generally has a thickness dimension T1 that is between about 0.50 and about 4.00 mm. The cooling block 106 may further comprise support structures 802a, 802b. These support structures 802a, 802b are usually optional and may have a geometry that matches and is complimentary to structures of the CPU socket 102c.

FIG. 8 further illustrates the flow of cooling fluid across the micro-pin fins 206 as indicated by arrows 307. The apertures/cooling block ports 602a, 602b which are part of the manifold 104 (not shown) have been superimposed on edges of the micro-pin fin surface 206 to illustrate how fluid leaves the manifold 104 (not shown) from the first aperture 602a and travels across the micro-pin fins 206 and back out of the second aperture 602b. Further details of the cooling fluid flow across the micro-pin fins is illustrated in FIG. 9 and described below.

Figure 9:
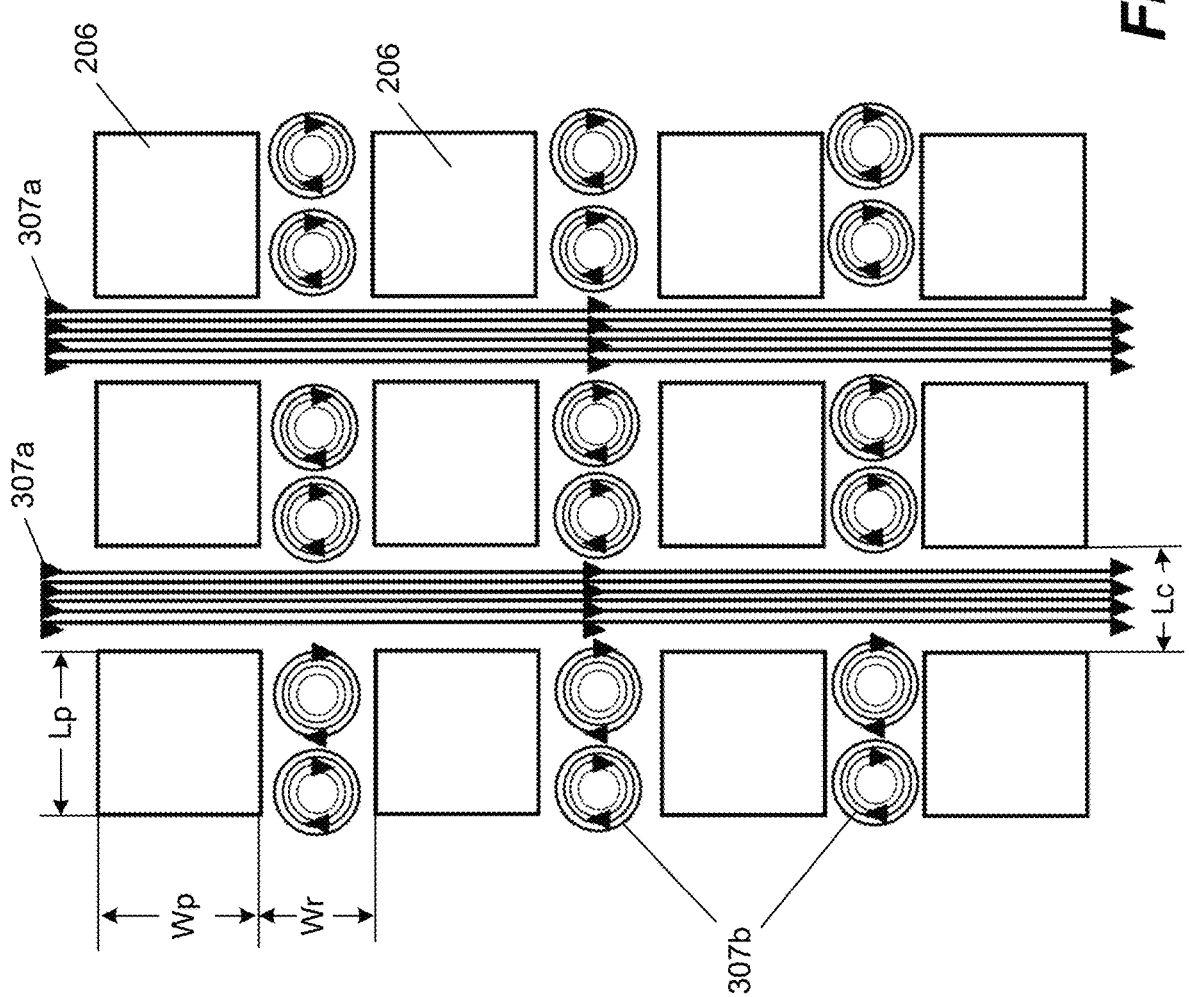
FIG. 9 illustrates a close-up/magnified view of the micro-pin fins which are disposed on the cooling block.

Referring now to FIG. 9, this figure illustrates a close-up/magnified view of the micro-pin fins 206 which are disposed on the cooling block 106. This view illustrates exemplary dimensions length Lp, width Wp for each micro-pin fin 206. Also illustrated are exemplary fluid flows 307a, 307b. Specifically, fluid flow arrows 307a denote flow lanes between the micro-pin fins 206. And fluid flow arrows 307b denote recirculation zones between micro-pin fins 206 as understood by one of ordinary skill in the art. As illustrated in FIG. 9, according to this illustrated exemplary embodiment, each micro-pin fin 206 has a rectangular cross-section, such that the length Lp and width Wp dimension are substantially equal.

FIG. 9 also shows the length Lc dimension between each column of micro-pin fins 206 as well as the width dimension Wr between each row of micro-pin fins 206. All four of these dimensions, Lp, Wp, Lc, and Wr may comprise a magnitude of between about 0.05 mm to about 1.0 mm. These dimensions are dependent on the type of electronic component 110 (i.e. how much heat it may produce—processing component vs. non-processing component like a resistor or capacitor), the size of the component 110, and its power dissipation requirements.

According to one exemplary embodiment, the inventors have created micro-pin fins 206 such that the four dimensions Lp, Wp, Lc, and Wr are substantially equal. For the exemplary embodiment illustrated in FIG. 9, the four dimensions may have a magnitude of approximately 0.30 mm. However, other magnitudes and other ranges than those disclosed above are possible and are included within the scope of this disclosure. Similarly, while the cross-sections of the micro-pin fins are shown to be square in shape, other shapes are possible. Other shapes include, but are not limited to, circular, elliptical, rectangular, and hybrid/polygonal shapes.

Figure 10:
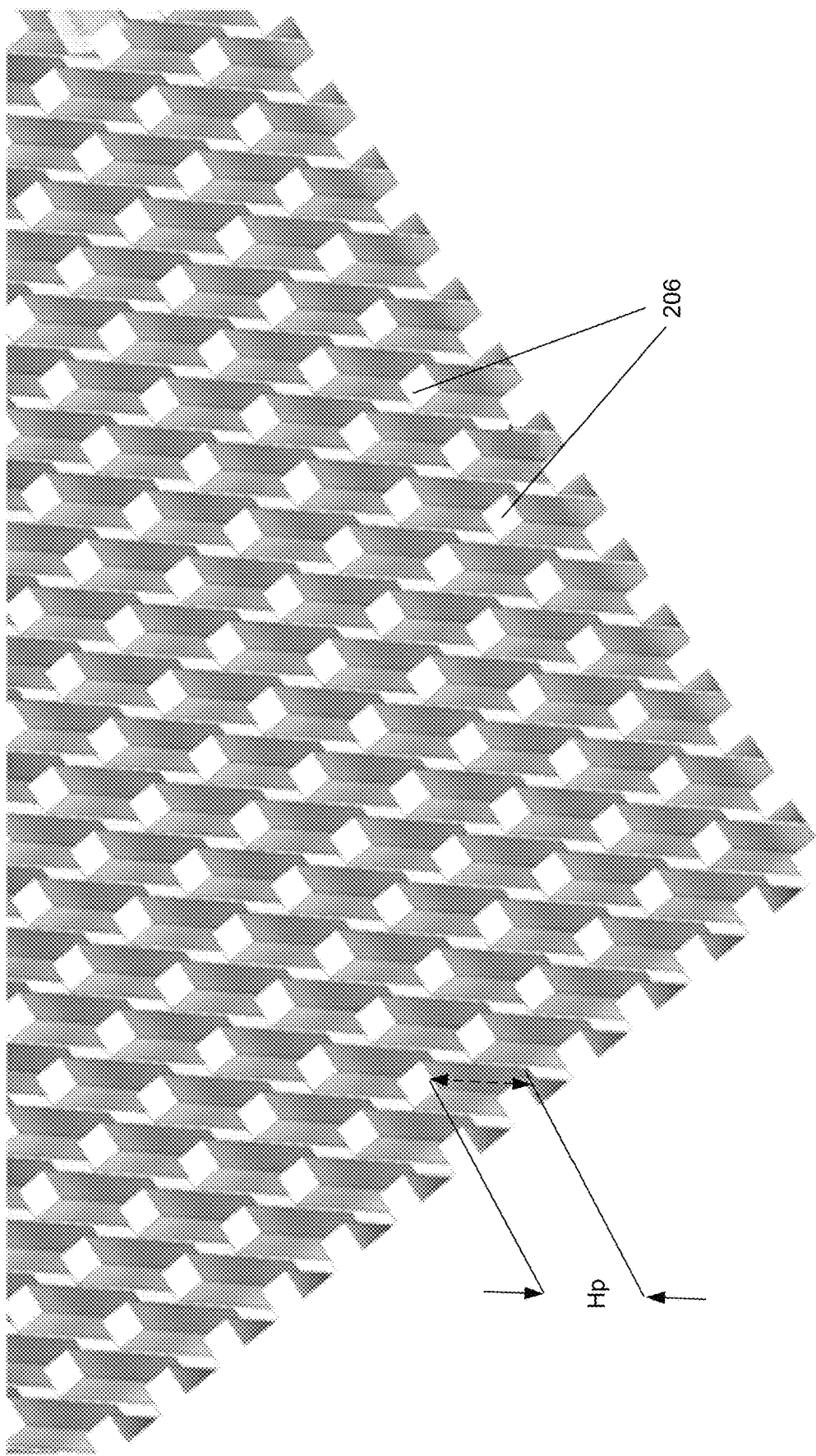
FIG. 10 illustrates a magnified or an enlarged, isometric view of the micro-pin fins illustrated in FIG. 9 according to one exemplary embodiment

Referring now to FIG. 10, this figure illustrates a magnified or an enlarged, isometric view of the micro-pin fins 206 illustrated in FIG. 9. The micro-pin fins 206, generally, occupy a surface area that matches a surface area of the heat producing surface 110 (i.e. the surface of the electronic component 110). For most applications, the closer the surface area occupied by the micro-pin fins 206 relative to the heat producing surface 110 that is coupled to the TIM layer 108, then this generally increases the efficiency in heat transfer from the heat producing surface 110.

This heat generation surface area matching parameter of the system 101 is generally opposite in design and/or the concept of conventional heat spreaders which, by their name implies, provides surface areas which are usually much larger than the heat producing surface 110. And because the surface areas of the conventional solutions (i.e. heat spreaders) are much larger, this generally increases their inefficiency of transferring heat away from the heat producing surface 110 since much of the heat must be moved across material that is in a solid state—i.e. is a solid and is not being transferred by a liquid, compared to the inventive system 101 described in this disclosure.

FIG. 10 also provides the height dimension Hp of the micro-pin fins 206. The height dimension Hp may comprise a magnitude between about 1.0 mm and about 4.0 mm, and preferably, between about 1.5 mm and 3.0 mm. However, other ranges are possible and are included within the scope of this disclosure.

The micro-pin fins 206 are usually made by subtractive manufacturing methods. Subtractive manufacturing methods include, but are not limited to, computer numerical control (CNC) milling, chemical processes such as etching, and other methods as understood by one of ordinary skill in the art. Other methods besides subtractive manufacturing methods are possible and are included within the scope of this disclosure.

Figure 11:
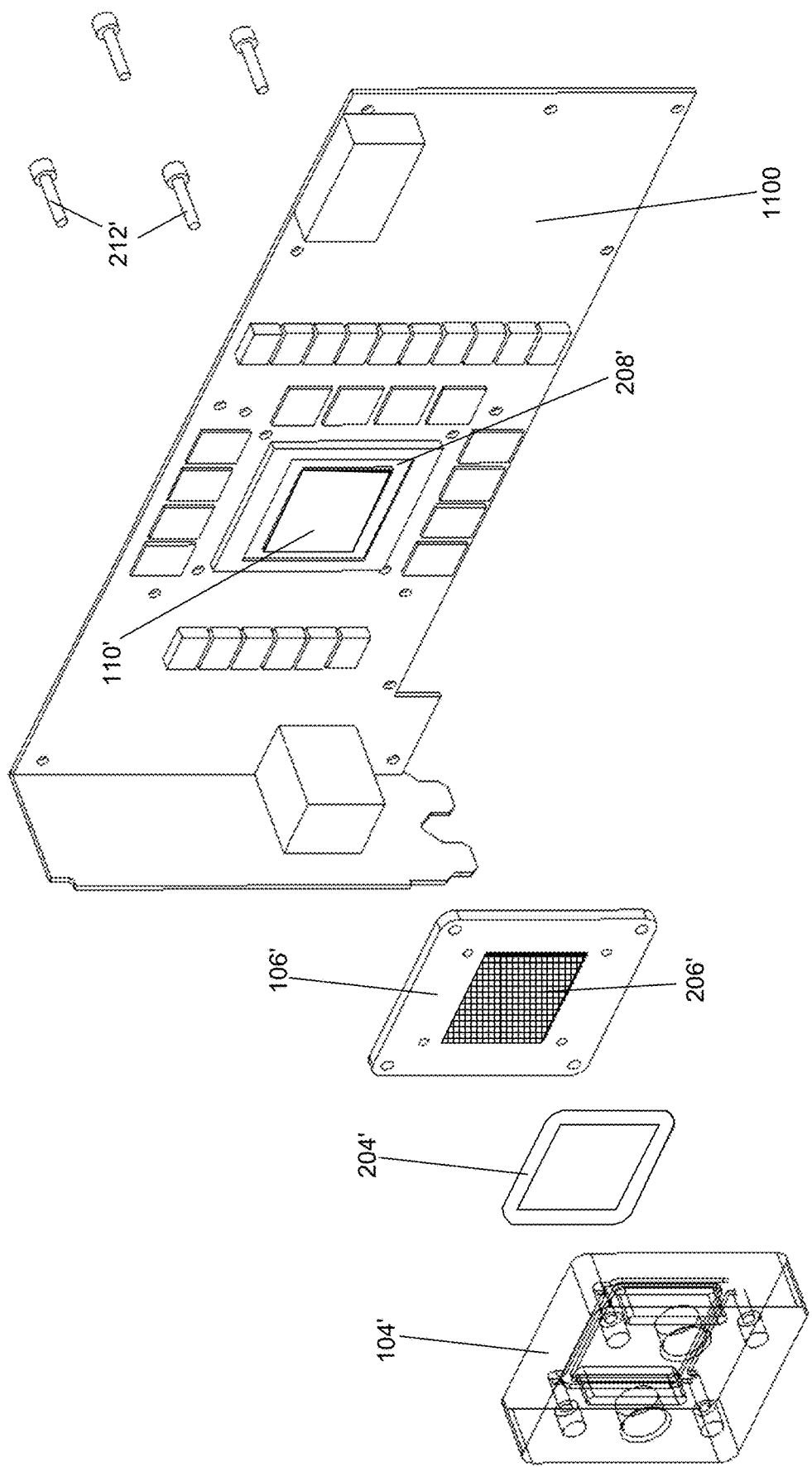
FIG. 11 illustrates an isometric, exploded view of the system according to an alternative exemplary embodiment FIG. 12. illustrates an elevational view of the alternative exemplary embodiment of FIG. 11.

Referring now to FIG. 11, this figure illustrates an isometric, exploded view of the system according to an alternative exemplary embodiment. This alternative exemplary embodiment is similar to the previous embodiments illustrated in FIGS. 2-8, so only the differences will be noted in this section.

According to this exemplary embodiment, electronic component 110' may comprise a graphical processing unit (GPU). And according to this exemplary embodiment, the mechanical fastening system 102 only comprises fasteners 112' that couple to the square-shaped manifold 104'. That is, the first and second fastening plates 102a, 102b as illustrated in the exemplary embodiment of FIG. 2, are not used in this alternative exemplary embodiment shown in FIG. 11.

Further, the CPU socket 102c of FIG. 2 is also not present in this exemplary GPU embodiment of FIG. 11. Further, the GPU 110' has more of a rectangular surface area compared to the more square shaped surface area of the electronic component 110 illustrated in FIGS. 2-8. In this FIG. 11, the GPU 110' is coupled to an original equipment manufacturer (OEM) printed circuit board (PCB) or "mother-board." Any remaining elements common to the prior exemplary embodiments of FIGS. 2-9 may function in a similar manner for this exemplary embodiment of FIG. 11.

Figure 12:
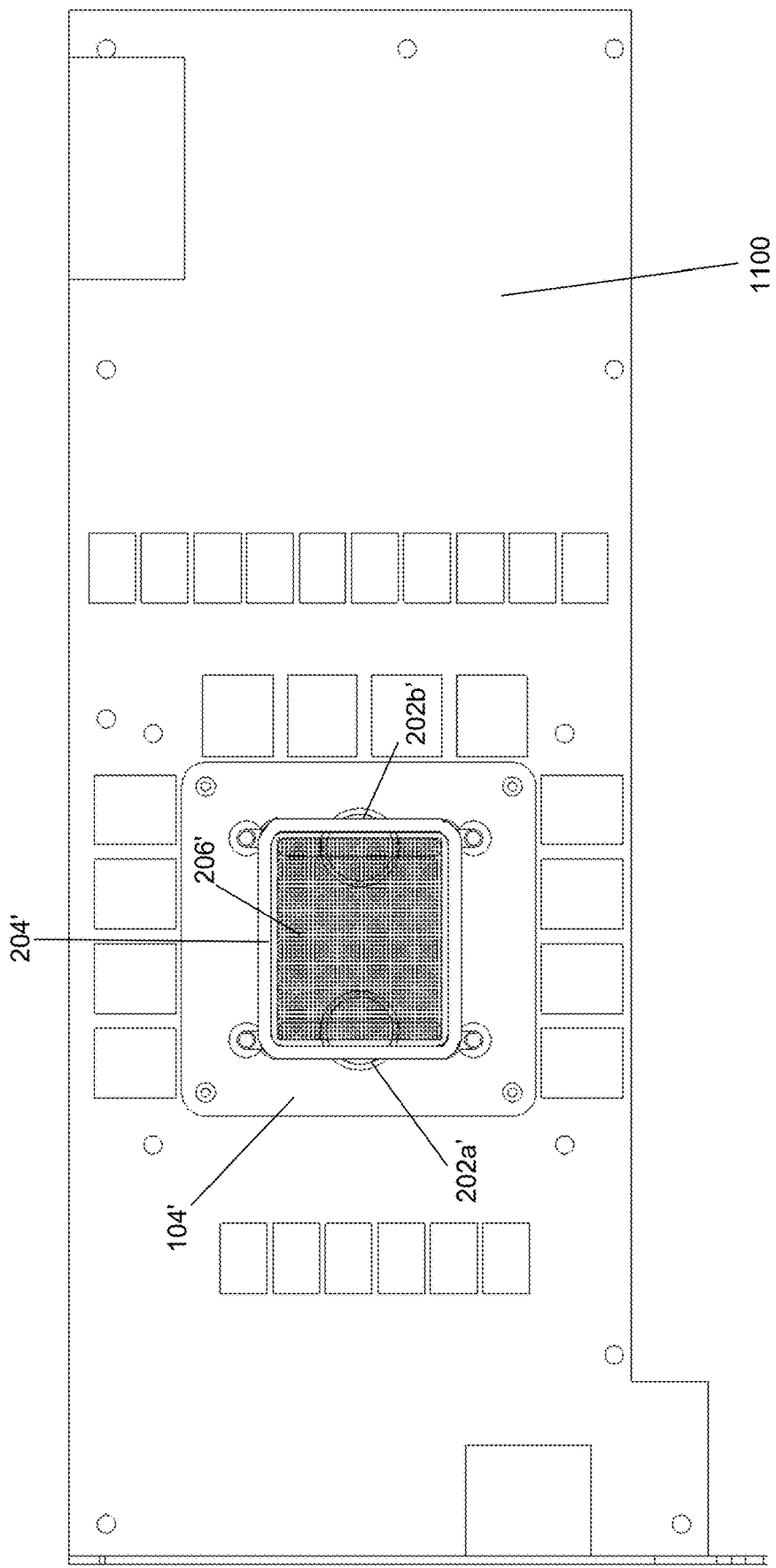

Referring now to FIG. 12, this figure illustrates an elevational, assembled view of the alternative exemplary embodiment of FIG. 11. The square-shaped manifold 104' may also have inlet and outlet ports 202a', 202b'. According to this view, the relative size of the surface area occupied by the micro-pin fins 206' is more apparent compared to the exemplary embodiment of FIGS. 2-8. The surface area of the GPU 110' of this embodiment of FIGS. 11-12 is larger than the surface area of the electronic component 110 of the embodiment illustrated in FIGS. 2-8, and hence, the surface area of the micro-pin fins 206' matches/corresponds with this larger surface area as understood by one of ordinary skill in art in view of the explanation provided above. Note that while a GPU 110' is identified for this exemplary embodiment of FIGS. 11-12, the GPU 110' could easily be any other electronic component 110 or a combination of electronic components 110 mentioned previously.

Figure 13:
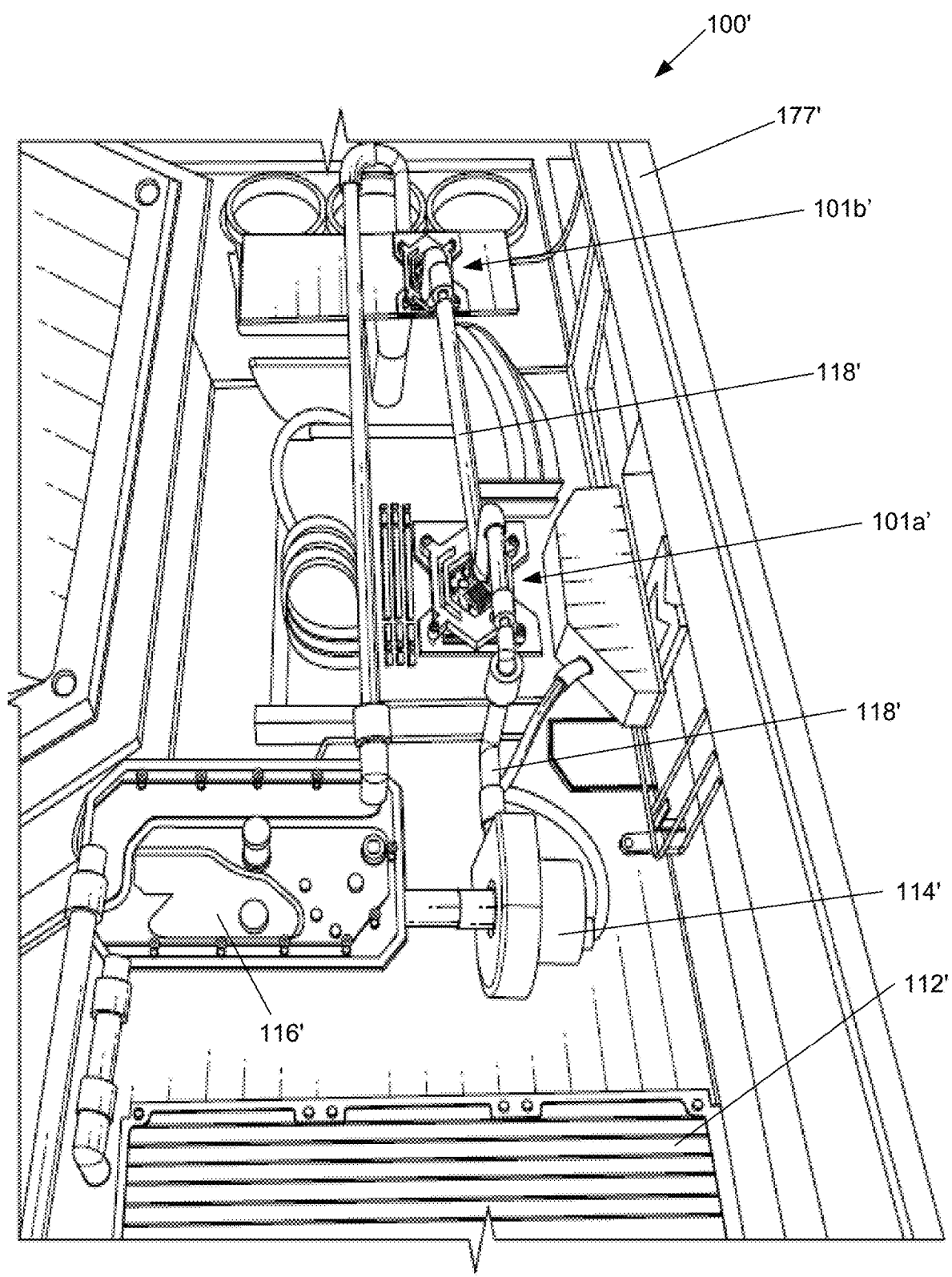
FIG. 13 illustrates an exemplary embodiment of the system in which two cooling subsystems share a pump system and a radiator.

Referring now to FIG. 13, this figure illustrates an exemplary embodiment of the system 100' in which two cooling subsystems 101a', and 101b' share a pump system 114' and a radiator 112'. The system 100' may further comprise a pump reservoir 116'. An all components could be contained within an exemplary housing 177'. In this exemplary embodiment, the two cooling subsystems 101' may further share conduits 118' and are connected in series. The two cooling subsystems 101' could easily provide cooling for a central processing unit 110' and graphical processing unit 110" (both not shown in this figure but would be physically positioned under each cooling block 106 in each, single subsystem 101').

Figure 14:
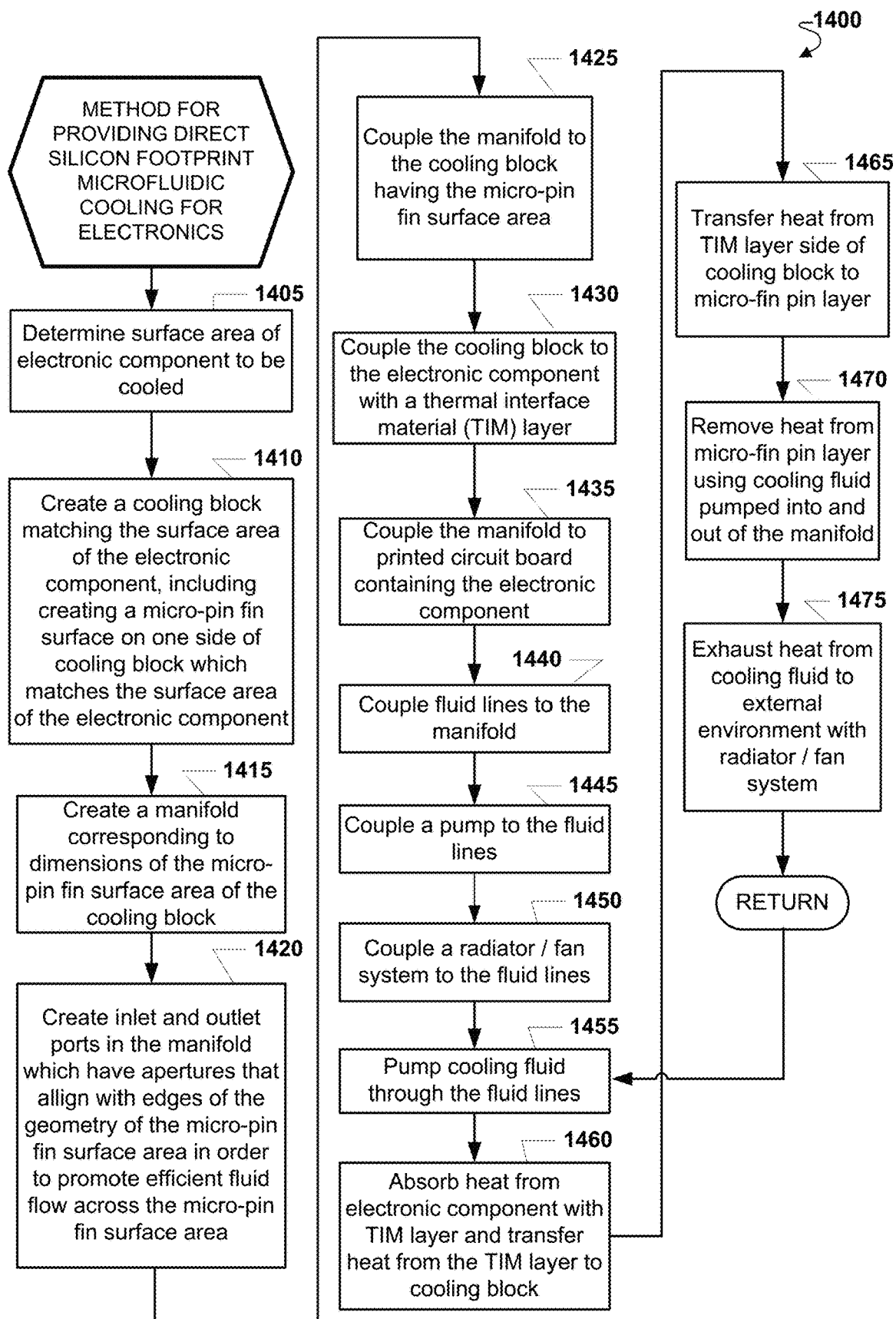
FIG. 14 is a logic flow diagram illustrating a method for providing direct silicon footprint microfluidic cooling for electronics according to one exemplary embodiment.

Referring now to FIG. 14, this figure is a logic flow diagram illustrating a method 1400 for providing direct silicon footprint microfluidic cooling for electronics. Step 1405 is the first step of the method 1400. In step 1405, the surface area of the electronic component 110 to be cooled is determined. Next in step 1410, a cooling block 106 is created to match the surface area/footprint of the electronic component 110. This step 1410 may include creating a micro-pin fin surface 206 on one side of the cooling block 106 that matches the surface area of the electronic component 110.

As noted previously, the electronic component 110 may comprise a processing component. A processing component 110 may include, but is not limited to, central processing units (CPUs), graphical processing units (GPUs), digital signal processors (DSPs), multi-core CPUs, field programmable gate arrays (FPGAs), and other similar integrated circuits (ICs) and/or systems on a chips (SOCs) that may support software applications running on a computer. The electronic component may comprise other elements besides processing components, such as operational amplifiers, modems, radio-frequency (RF) oscillators, resistors, inductors, capacitors, diodes, transistors, etc.

Next, in step 1415, a manifold 104 corresponding to the dimensions of the micro-pin fin surface area of the cooling block 106 is created. The manifold 104 usually has dimensions which are a little greater than the dimensions of the cooling block 106. Next, in step 1420, inlet and outlet ports 202 are created in the manifold 104 where the ports 202 further have apertures/cooling block ports 602. The apertures/cooling block ports 602 align with the edges of the geometry of the micro-pin fin surface area 206 in order to promote efficient fluid flow across the micro-pin fin surface area 206, as explained above in connection with FIGS. 8-9.

Subsequently, in step 1425, the manifold 104 is coupled to the cooling block 106 having the micro-pin fin surface area 206. The micro-pin fin surface area 206 generally faces the cooling block 106. Usually, the manifold 104 is coupled to the cooling block 106 with mechanical fasteners, such as screws, which mate with threaded holes 202 positioned within cooling block 106. However, as noted previously, other forms/structures for coupling the manifold 104 to the cooling block are possible and are included within the scope of this disclosure. Further, a gasket 204, is usually positioned between the manifold 104 and the cooling block in order to form a liquid-tight seal.

Next in step 1430, the cooling block 106 is coupled to the electronic component 110 with a thermal interface material (TIM) layer 108. As noted previously, the thermal interface material (TIM) layer 108 may comprise anyone or a combination of materials. Exemplary materials include, but are not limited to, thermal grease, thermal adhesives, thermal gap fillers, a thermally conductive pad that may include silicon or silicon-like materials, thermal tapes, Phase-change materials (PCM), Metal thermal interface materials (such as liquid gallium or indium foils), and other similar heat-conducting type materials.

According to one exemplary embodiment, the TIM layer 108 may include a material branded as CONDUCTONAUT™ sold by Thermal Grizzly, known as of this writing. It is understood that this CONDUCTONAUT™ brand material comprises a gallium-based liquid (commercially referred to as "a liquid metal"). However, other materials are possible as described above. TIM layer 108 generally is spread over the entire surface of the electronic component 110. The TIM layer 108 couples to and is in direct contact with the cooling block 106.

Next, in step 1435, the manifold 104 is coupled to the printed circuit board/structure for containing the electronic component 110. For example, see the printed circuit board (PCB) 1100 as illustrated in FIG. 11. Fasteners 212 may be used to couple/attach the manifold to the PCB 1100. Fasteners 212 may comprise screws, but other fasteners are possible and are included within the scope of this disclosure.

Subsequently, in step 1440, fluid lines 118 are coupled to the manifold 104 as illustrated in FIG. 3. The fluid lines 118 may use standard couplers/fixtures 302 as described previously. Next, in step 1445, a pump or pump system 114 is coupled to the fluid lines 118. As described above, the pump system 114 may comprise off-the-shelf products, such as D5 LOWARA™ brand water pumps sold by Xylem Inc., known as of this writing. According to one exemplary embodiment, the pump system 114 may provide cooling fluid flow rates of between about 100.0 and about 1500.0 liters per hour (LPH). However, other fluid flow rates are possible and are within the scope of this disclosure.

Next, in step 1450, a radiator/fan system 112 may then be coupled to the fluid lines 118. The radiator/fan system 112 may comprise a radiator and a fan that pulls or pushes air across the radiator. Off-the-shelf radiator/fan systems 112 may be employed. For example, one radiator/fan system 112 is sold by Hardware Labs Performance Systems, Inc. under the brand name of BLACK ICE™, known as of this writing.

Subsequently, in step 1455, cooling fluid may be pumped through the fluid lines/conduits 118 with the pump system 114 once all of the fluid connections are made. The fluid moved by the pump 114 within the conduits 118 preferably comprises distilled water. However, other fluids such as synthetic coolants, like ethylene-glycol-based radiator fluids, dielectric coolants, or super-cooled fluids, like liquid nitrogen may be employed without departing from this disclosure.

Next, in step 1460, heat is absorbed/transferred from the electronic component 110 with the TIM layer 108 and transferred from the TIM layer 108 to the surface of the cooling block 106 coupled to the TIM layer 108. Subsequently, in step 1465, heat is transferred from the surface of the cooling block facing the TIM layer 108 thorough the cross-section of the cooling block 106 to the micro-pin fins 206 of the cooling block 106.

Next, in step 1470, heat is removed/transferred from the micro-pin fin layer 206 using the cooling fluid that is pumped into and out of the manifold 104 via inlet and outlet ports 202, and which is pumped and evenly distributed through apertures/cooling block ports 602 disposed within the manifold 104. The cooling fluid flow across the micro-pin fin layer 206 is described above and illustrated in FIGS. 8-9.

Subsequently, in step 1475 heat is carried by the cooling fluid through fluid lines/conduits 118 and then is exhausted to the external environment relative to the fluid lines 118 via the radiator/fan system 112. The method then returns and goes back to step 1455, in which the cooling fluid is pumped through the fluid lines 118 to the manifold 104.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Figure 15:
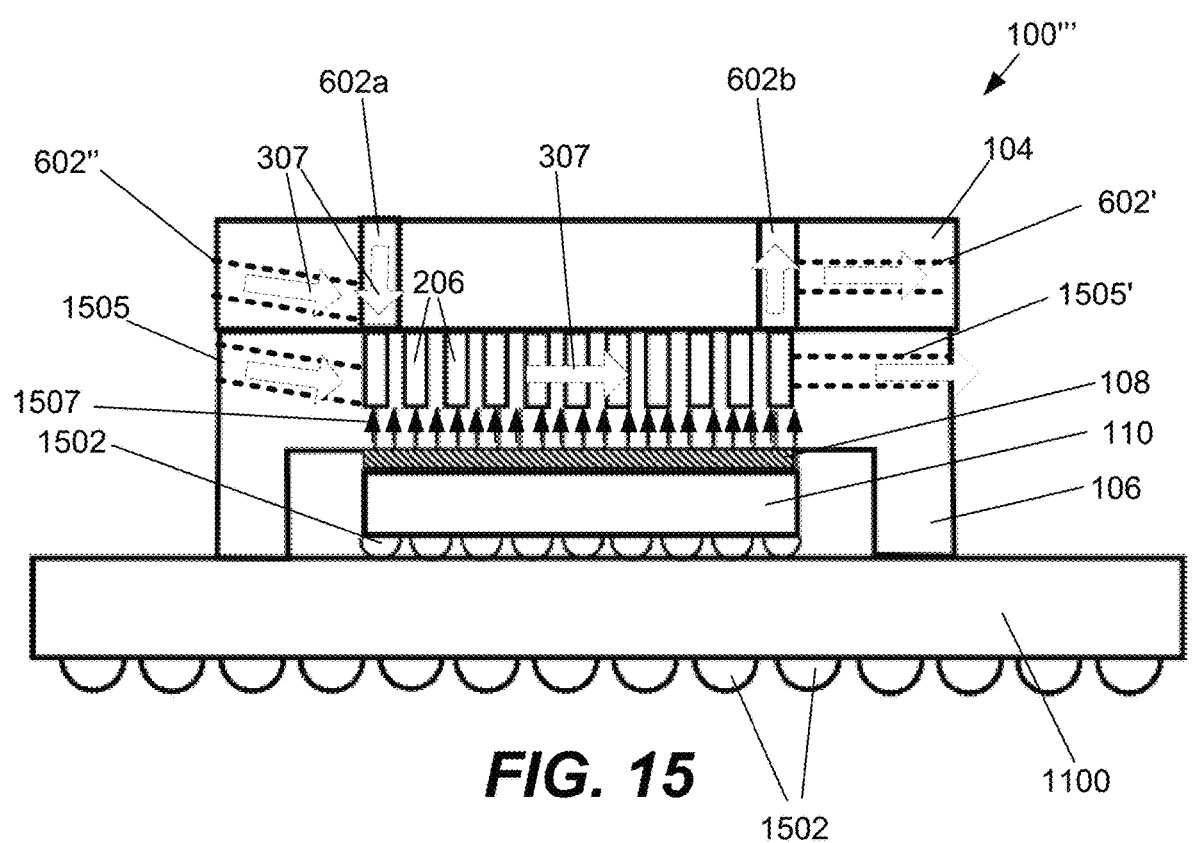
FIG. 15 illustrates a theoretical model of a system for providing direct silicon footprint microfluidic cooling for electronic components according to one exemplary embodiment.

Referring to FIG. 15, this figure illustrates a theoretical model of a system 100''' for providing direct silicon footprint microfluidic cooling for electronic components 110. In thermal sciences, there is a useful tool to describe heat transfer systems called a resistance network; this tool accounts for each of the resistances (or obstacles) that the heat encounters during its path of removal to the ambient/external environment which is usually air.

The ideal heat transfer system (impossible due to the laws of thermodynamics) is the one in which the thermal resistance is zero, meaning that any amount of heat could be dissipated at the same ambient temperature. Therefore, the best (feasible) heat transfer system is one in which the total resistance is the lowest.

Thinking of heat as a vehicle that needs to go from point A to point B, the resistance as the path, and the goal as traveling that distance in the shortest time (fastest heat removal); then it makes sense that the overall resistance length to be as short as possible. Bearing those analogies in mind, then it is easy to understand the comparison of conventional liquid cooling approaches and the inventive system 100 described above.

Due to the small dimensions of the silicon die in a number of commercial CPUs 110, conventional Integrated Heat Spreaders (IHS) are used to increase the surface area over which the heat is removed. While this may seem a good way to remove heat in a passive manner and without fluid cooling, it actually generates what is called "spreading resistance" as it makes the heat path through solid objects much longer.

In other words, removing the heat from a small silicon chip 110 comes at the expense of a larger resistance network formed by one or more solid objects through which the heat may be moved/transferred—usually through one or more thin metal plates. These thin metal plates usually have a surface area significantly greater than that of the electronic component producing the unwanted heat.

The inventive microfluidic cooling system 100 can unlock the high-frequency potential on flagship CPUs/GPUs while operating well below the thermal limits of the internal circuitry of these processing components. This means that a computing system cooled by system 100 may be accelerated to its highest potential while also protecting the electronic component(s) 110 from any form of thermal throttling/ damage.

The exemplary embodiments of system 100 described above and illustrated in FIGS. 1-13 describe cooling microstructures, micro-pin fins 206, that are optimized based on the architecture (surface area) and heat footprint (thermal energy capacity of a chip 110); this approach allows unparalleled cooling performance when compared with any other cooling technology described in the prior art.

In FIG. 15, the heat/thermal energy represented by arrows 1507 produced by the electronic component 110 may be removed almost directly at the source 110 through a chip-specific microfluidic cooling layer formed by the cooling block 106 and its micro-fin pins 206, which may be optimized for specific electronic components 110 (i.e. components 110 each having unique geometries/surface areas AND unique thermal/heat generation footprints) in order to mitigate any heat spreading effects. The heat/thermal energy represented by arrows 1507 flowed from the electronic component, through the thermal interface material (TIM) layer 108 and through the cooling block 106 to the micro-pin fins 206.

The ambitious goal of removing the heat in such a small area adjacent to the electronic component 110 is accomplished through micro-machined structures, micro-pin fins 206, having a high-aspect ratio, which significantly enhance cooling fluid mixing and heat transfer within the cooling block 106.

With the combination of these multiple features, the heat spreading resistances by system 100''' are eliminated from the overall theoretical network, while also reducing contact and convective resistances. With a significantly lower overall heat transfer resistance compared to conventional technologies, it is possible to dissipate higher power at lower silicon temperatures; which is one of the key advantages of the microfluidics of system 100'''.

FIG. 15 further illustrates solder beads and/or metal traces 1502 which may be present on a printed circuit board (PCB) 1100 and on the bottom of an electronic component 110. It is noted that the relative thickness of the thermal interface material (TIM) layer 108 is slightly exaggerated so that it is visible in this theoretical model. Cooling fluid arrows 307 show directional flow of the cooling fluid through the cooling block ports 602a, 602b and across the micro-pin fins 206. It is noted that the cooling fluid flow direction may be easily changed as desired and as understood by one of ordinary skill in the art.

Additionally, FIG. 15 further illustrates other, optional cooling block ports 602' prime and 602" double-prime. These cooling block ports 602', 602" have been illustrated with dashed lines to show that they are optional and/or could be constructed in addition to the other ports 602. That is, ports 602', 602" may be provided in addition to the other ports 602 or these ports 602', 602" may be provided as alternatives to the vertical ports 602. Port 602' prime is illustrated in a horizontal direction while port 602" double-prime is illustrated at an angle other than vertical and horizontal relative to the page.

These two ports 602', 602" within the manifold 104 demonstrate that ports can be made at angles other than vertical and horizontal as a particular application/use may require. And it is possible to have ports 602 within the manifold 104 which are at different angles relative to each other. That is, it is possible to have a first port 602 disposed at a first angle, say vertical relative to the page, and a second port 602 disposed at a second angle, say horizontal relative to the page. Thus, various angles as well as the number of ports 602 within the manifold are possible and included within the scope of this disclosure.

FIG. 15. further illustrates additional/optional fluid ports 1505, 1505' disposed in the cooling block 106 itself. These fluid ports 1505 in the cooling block 106 could be provided as alternatives to the cooling block ports 602 disposed within the manifold 104. Or these fluid ports 1505 could be made in addition to the ports 602 disposed within the manifold 104. The first fluid port 1505 may be provided at a angle other than vertical or horizontal as shown. Meanwhile, a second fluid port 1505' may be provided in a horizontal angle as shown. Other angles, such as vertical, for these fluid ports 1505 within the cooling block 106 are possible and are included within the scope of this disclosure. Various combinations of ports 602 within the manifold 104 and ports 1505 within the cooling block 106 are possible and are thus, included within the scope of this disclosure as understood by one of ordinary skill in the art.

According to this exemplary embodiment shown in FIG. 15, the cooling block 106 is shown to enclose or encapsulate the electronic component 110. Further, fastening systems and/or fastening mechanisms (i.e. fasteners) for holding the manifold 104 against the cooling block 106 and holding the manifold 104 against the PCB 1100 are not illustrated.

Although a few embodiments have been described in detail above, those skilled in the art will readily appreciate that many modifications are possible in the embodiments without materially departing from this disclosure. Accordingly, such modifications are intended to be included within the scope of this disclosure as defined in the following claims. In the claims, means-plus-function clauses are intended to cover the structures described herein as performing the recited function and not only structural equivalents, but also equivalent structures.

Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, sixth paragraph for any limitations of any of the claims herein, except for those in which the claim expressly uses the words 'means for' together with an associated function.

Therefore, although selected aspects have been illustrated and described in detail, it will be understood that various substitutions and alterations may be made therein without departing from the spirit and scope of the present invention, as defined by the following claims.

What is claimed is:

1. A system for providing direct electronic component cooling, comprising:
   a plurality of electronic components, wherein each of the plurality of electronic components comprises:
      a cooling block comprising a first side and a second side;
      a plurality of micro-pin fins disposed on the first side of the cooling block, the plurality of micro-pin fins defining a first surface area on the first side of the cooling block;
      a thermal interface material layer contacting the second side of the cooling block, the thermal interface material layer also contacting an electronic component, the electronic component defines a second surface area; and
      a manifold coupled to the cooling block and facing the plurality of micro-pin fins, wherein the manifold comprises an inlet port and an outlet port for supporting a cooling fluid flowing between the inlet port and the outlet port, the cooling fluid from the inlet port and the outlet port also flowing between the plurality of micro-pin fins for removing heat from the plurality of micro-pin fins collected by the cooling block from the thermal interface layer;
      a fluid gasket sandwiched between the manifold and the first side of the cooling block, the fluid gasket outlining the first surface area such that the fluid gasket has a geometry and size that matches a perimeter geometry defined by micro-pin fins at edges of the first surface area, the fluid gasket providing a tight fluid seal that encloses the first surface area containing the plurality of micro-pin fins which is actively cooled by the cooling fluid;
      the first surface area defined by the plurality of micro-pin fins on the first side of the cooling block is equal to the second surface area defined by the electronic component in both size and geometry, such that the system provides a compact cooling solution for the electronic component.

2. The system of claim 1, wherein the electronic component comprises at least one of a: central processing unit (CPU), a graphical processing unit (GPU), a digital signal processor (DSP), a multi-core CPU, a field programmable gate array (FPGA), an integrated circuit (IC), a system on a chip (SOC), an operational amplifier, a modem, a radio-frequency (RF) oscillator, a resistor, an inductor, a capacitor, a diode, and a transistor.

3. The system of claim 1, further comprising one or more conduits coupled to the inlet port and the outlet port.

4. The system of claim 3, further comprising a pump for pumping the cooling fluid, the pump being coupled to the one or more conduits.

5. The system of claim 4, further comprising a radiator coupled to the one or more of the conduits.

6. The system of claim 1, wherein the cooling block is made from metal and the plurality of micro-pin fins are machined from that metal.

7. A system for providing direct electronic component cooling, comprising:
   a plurality of electronic components, wherein each of the plurality of electronic components comprises:
      a cooling block comprising a first side and a second side;
      a plurality of micro-pin fins disposed on the first side of the cooling block, the plurality of micro-pin fins defining a first surface area on the first side of the cooling block;
      a thermal interface material layer contacting the second side of the cooling block, the thermal interface material layer also contacting a heat producing surface, the heat producing surface comprising a side of an electronic component, the side of the electronic component defining a second surface area;
      a manifold coupled to the cooling block and facing the plurality of micro-pin fins, wherein the manifold comprises an inlet port and an outlet port for supporting a cooling fluid flowing between the inlet port and the outlet port, the cooling fluid from the inlet port and the outlet port also flowing between the plurality of micro-pin fins for removing heat from the plurality of micro-pin fins collected by the cooling block from the thermal interface layer;
      means for holding the manifold against the heat producing surface;
      a fluid gasket sandwiched between the manifold and the first side of the cooling block, the fluid gasket outlining the first surface area such that the fluid gasket has a geometry and size that matches a perimeter geometry defined by micro-pin fins at edges of the first surface area, the fluid gasket providing a tight fluid seal that encloses the first surface area containing the plurality of micro-pin fins which is actively cooled by the cooling fluid; and
      the first surface area defined by the plurality of micro-pin fins on the first side of the cooling block is equal to the second surface area defined by the side of the electronic component in both size and geometry, such that the system provides a compact cooling solution for the electronic component.

8. The system of claim 7, wherein the means for holding comprises at least one fastener.

9. The system of claim 7, wherein the electronic component comprises at least one of a: central processing unit (CPU), a graphical processing unit (GPU), a digital signal processor (DSP), a multi-core CPU, a field programmable gate array (FPGA), an integrated circuit (IC), a system on a chip (SOC), an operational amplifier, a modem, a radio-frequency (RF) oscillator, a resistor, an inductor, a capacitor, a diode, and a transistor.

10. A system for providing direct electronic component cooling, comprising:
   a plurality of electronic components, wherein each of the plurality of electronic components comprises:
      a cooling block comprising a first side and a second side;
      a plurality of micro-pin fins disposed on the first side of the cooling block, the plurality of micro-pin fins defining a first surface area on the first side of the cooling block;
      a thermal interface material layer contacting the second side of the cooling block, the thermal interface material layer also contacting a heat producing surface, the heat producing surface comprising a side of an electronic component, the side of the electronic component defining a second surface area;

a manifold coupled to the cooling block and facing the plurality of micro-pin fins, wherein the manifold comprises an inlet port and an outlet port for supporting a cooling fluid flowing between the inlet port and the outlet port, the cooling fluid from the inlet port and the outlet port also flowing between the plurality of micro-pin fins for removing heat from the plurality of micro-pin fins collected by the cooling block from the thermal interface layer;

a device for holding the manifold against the heat producing surface;

a fluid gasket sandwiched between the manifold and the first side of the cooling block, the fluid gasket outlining the first surface area such that the fluid gasket has a geometry and size that matches a perimeter geometry defined by micro-pin fins at edges of the first surface area, the fluid gasket providing a tight fluid seal that encloses the first surface area containing the plurality of micro-pin fins which is actively cooled by the cooling fluid; and the first surface area defined by the plurality of micro-pin fins on the first side of the cooling block is equal to the second surface area defined by the side of the electronic component in both size and geometry, such that the system provides a compact cooling solution for the electronic component.

11. The system of claim 10, wherein the inlet port and the outlet port each further comprise a cooling block port having a first geometry that corresponds with edges of a second geometry formed by the plurality of micro-pin fins disposed on the first side of the cooling block.

12. The system of claim 10, wherein the device for holding comprises a fastener, the fastener comprising at least one of a screw, a rivet, a bolt, a nut, and an adhesive.

13. The system of claim 10, wherein the electronic component comprises at least one of a: central processing unit (CPU), a graphical processing unit (GPU), a digital signal processor (DSP), a multi-core CPU, a field programmable gate array (FPGA), an integrated circuit (IC), a system on a chip (SOC), an operational amplifier, a modem, a radio-frequency (RF) oscillator, a resistor, an inductor, a capacitor, a diode, and a transistor.

* * * * *